(12) United States Patent
Kuisma

(10) Patent No.: US 11,137,251 B2
(45) Date of Patent: Oct. 5, 2021

(54) PIEZOELECTRIC RING GYROSCOPE

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 238 days.

(21) Appl. No.: 16/406,603

(22) Filed: May 8, 2019

(65) Prior Publication Data

US 2019/0346266 A1 Nov. 14, 2019

(30) Foreign Application Priority Data

May 8, 2018 (FI) .................................... 20185422

(51) Int. Cl.
*G01C 19/5712* (2012.01)
(52) U.S. Cl.
CPC ............... *G01C 19/5712* (2013.01)
(58) Field of Classification Search
CPC ............ G01C 19/5677; G01C 19/5712; G01P 2015/084
See application file for complete search history.

(56) References Cited

U.S. PATENT DOCUMENTS

| | | | |
|---|---|---|---|
| 5,226,321 A | 7/1993 | Varnham et al. | |
| 5,932,804 A | 8/1999 | Hopkin et al. | |
| 6,539,804 B1 | 4/2003 | Iwata | |
| 8,479,575 B2 | 7/2013 | Kempe | |
| 8,803,624 B2* | 8/2014 | Phan Le | H03H 9/2431 331/154 |
| 2004/0144174 A1* | 7/2004 | Fell | G01C 19/5684 73/504.12 |

(Continued)

FOREIGN PATENT DOCUMENTS

| | | |
|---|---|---|
| CN | 104897145 A | 9/2015 |
| EP | 2239541 A1 | 10/2010 |
| JP | H10132571 A | 5/1998 |
| JP | H11304494 A | 11/1999 |
| WO | WO 2017/130312 A1 | 8/2017 |

OTHER PUBLICATIONS

Oct. 4, 2019 Search Report issued in European Patent Application No. 19172224.

(Continued)

*Primary Examiner* — Paul M. West
*Assistant Examiner* — Mark A Shabman
(74) *Attorney, Agent, or Firm* — Squire Patton Boggs (US) LLP

(57) ABSTRACT

A ring gyroscope which comprises a substantially circular and flexible ring which defines a ring plane, one or more primary piezoelectric split transducers configured to drive the ring into resonance oscillation, four or more mass elements which form a symmetrical mass distribution in relation to both a first and a second transversal symmetry axis and to a first and a second diagonal symmetry axis. The ring gyroscope also comprises a suspension structure configured to support the weight of the ring and the mass elements, wherein the suspension structure comprises N outer suspenders, where N is an integer greater than or equal to two, and each outer suspender extends along a ring tangent from a suspension attachment point on the outer edge of the ring to an anchor point.

13 Claims, 14 Drawing Sheets

(56) References Cited

U.S. PATENT DOCUMENTS

| | | | |
|---|---|---|---|
| 2010/0058861 A1* | 3/2010 | Kuang | G01C 19/56 |
| | | | 73/504.12 |
| 2011/0308315 A1* | 12/2011 | Araki | G01C 19/5677 |
| | | | 73/504.12 |
| 2013/0167642 A1 | 7/2013 | Kuang et al. | |
| 2014/0090470 A1 | 4/2014 | Fujimoto | |
| 2015/0211855 A1* | 7/2015 | Ruohio | B81B 3/0043 |
| | | | 73/504.12 |
| 2016/0341552 A1 | 11/2016 | Kub | |
| 2018/0017386 A1 | 1/2018 | Mitani | |
| 2018/0245946 A1 | 8/2018 | Weinberg | |
| 2019/0346266 A1 | 11/2019 | Kuisma | |

OTHER PUBLICATIONS

Deyong Chen et al., "An electrostatically actuated micromachined vibrating ring gyroscope with highly symmetric support beams", Sensors, 2010 IEEE, IEEE, Piscataway, NJ, USA, Nov. 1, 2010, pp. 860-863.

Finnish Search Report dated Dec. 5, 2018 corresponding to Finnish Patent Application No. 20185422.

Finnish Search Report dated Dec. 4, 2018 corresponding to Finnish Patent Application No. 20185421.

U.S. Office Action corresponding to co-pending U.S. Appl. No. 16/406,640, dated Feb. 22, 2021.

* cited by examiner

PIEZOELECTRIC RING GYROSCOPE

FIELD OF THE DISCLOSURE

The present disclosure relates to sensors for measuring angular rotation rates, and more particularly to z-axis gyroscopes where the oscillation of a ring-shaped structure in a given plane is utilized to detect the magnitude of angular rotation about an axis perpendicular to that plane. The present disclosure further concerns transducers which may be used to drive the primary ring oscillation, to measure the magnitude of the primary ring oscillation, to detect the secondary ring oscillation induced by angular rotation, or to drive counter-oscillation in the secondary mode. The present disclosure also concerns means for adjusting the resonance properties of the ring with attached mass elements, and means for suspending the ring from a fixed substrate.

BACKGROUND OF THE DISCLOSURE

Microelectromechanical gyroscopes use the Coriolis effect to measure angular velocity. In vibrating MEMS gyroscopes, an object is driven into oscillating movement by an actuating drive force. This oscillation will be called "primary oscillation" or "drive oscillation" in this disclosure, and the oscillation mode will be labelled called the "primary mode". It may also be labelled the "primary resonance mode", since the ring typically vibrates in resonance. In MEMS gyroscopes the drive oscillation can involve linear or rotational oscillation of a solid inertial mass, but it can also involve flexible deformation of a ring-shaped structure. This disclosure focuses exclusively on applications of the latter kind.

When a ring in drive oscillation undergoes an angular rotation rate $\Omega$ about the z-axis (perpendicular to the xy-plane defined by the ring), the ring is affected by the Coriolis force $F_C$. The magnitude and direction of the Coriolis force on a given segment of the ring is determined by the magnitude and direction of vibrational motion on that segment of the ring and by the magnitude of the angular rotation rate vector. The oscillation caused by the Coriolis force in the ring will be called "secondary oscillation" or "sense oscillation" in this disclosure, and the oscillation mode will be labelled called the "secondary mode" or the "secondary resonance mode".

FIG. 1 illustrates the primary and secondary modes in an oscillating ring gyroscope. The thick ring 11 illustrates the ring in its rest position, which it obtains when it is entirely at rest or when the amplitudes of all vibration modes are zero. Two transversal symmetry axes $T_1$ and $T_2$ and two diagonal symmetry axes $D_1$ and $D_2$ are illustrated in the ring shown in FIG. 1.

The primary mode involves ring vibration along the two transversal symmetry axes. The two extremes of this vibrational movement have been illustrated with dotted lines in FIG. 1. The first dotted line 12 shows the shape of the ring when it has expanded along the first transversal axis $T_1$ and contracted along the second transversal axis $T_2$, while the second dotted line 13 shows the shape of the ring when it has expanded along the second transversal axis $T_2$ and contracted along the first transversal axis $T_1$. In primary oscillation the ring continuously switches between these two shapes.

When the ring undergoes an angular rotation rate $\Omega$ about the central z-axis (illustrated in the middle of the ring), segments on the ring are influenced by the Coriolis force $F_C$. The forces $F_C$ marked on the first dotted line 12 illustrate the local direction of the Coriolis force when the ring is expanding along the first transversal axis $T_1$. When segment 121 on the right-hand side moves in the positive x-direction, $F_C$ points in the negative y-direction in this segment. When segment 122 on the left-hand side moves in the negative x-direction, $F_C$ points in the positive y-direction in this segment. Simultaneously, segment 123 moves in the negative y-direction and $F_C$ points in the negative x-direction in this segment. Segment 124 moves in the positive y-direction and $F_C$ points in the positive x-direction in this segment, as illustrated in FIG. 1. When the ring again contracts along the first transversal axis $T_1$, the direction of the Coriolis forces are reversed in each segment (this situation is not illustrated).

Similarly, the forces $F_C$ marked on the second dotted line 13 illustrate the local direction of the Coriolis force when the ring is expanding along the second transversal axis $T_2$. When segment 131 moves in the negative x-direction, $F_C$ points in the positive y-direction. When segment 132 moves in the positive x-direction, $F_C$ points in the negative y-direction. Segment 133 moves in the positive y-direction and $F_C$ points in the positive x-direction, while segment 124 moves in the negative y-direction and $F_C$ points in the negative x-direction in this segment. The direction of the Coriolis forces are again reversed in each segment when the ring again contracts along the second transversal axis $T_2$ (this situation is not illustrated).

It can be seen from FIG. 1, that in the first vibrational extreme (12) of the ring, the Coriolis force acting on segments 121-124 expands the ring along the first diagonal axis $D_1$. It simultaneously contracts the ring along the second diagonal axis $D_2$. In the second vibrational extreme (13), the Coriolis force acting on segments 131-134 expands the ring along the second diagonal axis $D_2$ and contracts it along the first diagonal axis $D_1$. Segments 121-124 are the same parts of the ring as segments 131-134, respectively, but represent different phases of the oscillation.

For simplicity, the Coriolis force has been drawn only on these segments of the ring in FIG. 1. In reality, the Coriolis force will act at every point of the ring along its perimeter. Each local force component is proportional to the velocity of that point of the ring and to the angular rate, and is perpendicular to both. The integral of all the Coriolis force components causes an elliptic deformation of the ring along the first and second diagonal axes $D_1$ and $D_2$.

In other words, in the primary resonance mode the annular ring 11 deforms periodically to elliptic shapes 12 and 13 along the orthogonal transversal axes $T_1$ and $T_2$. If no angular rotation about the z-axis is present, there are four stationary nodal points 14 located at an angle of exactly 45 degrees from the transversal axes $T_1$ and $T_2$. These points 14 lie on the diagonal axes $D_1$ and $D_2$. The segments of the ring which lie at these nodal points 14 do not experience any linear movement in primary oscillation, only rotation around the node point.

In the secondary resonance mode, the elliptical deformations are turned by 45 degrees from the primary mode axes, as explained above. Mathematically (but not geometrically), the secondary mode is orthogonal to the primary mode, since all possible oscillations of the ring can be expressed as linear combinations of these two modes.

When the ring has been excited to the primary oscillation mode and undergoes an in-plane rotation around its center at a given rotation rate, the superposition of the two oscillations is an elliptic oscillation where the nodal points 14 are slightly shifted from the original locations. The angular rotation rate can be detected by measuring this shift.

Ring gyroscopes where the oscillations of the ring are driven by capacitive or electromagnetic means are known from the prior art. The detection of the secondary oscillation is typically performed by capacitive means. Documents U.S. Pat. Nos. 5,932,804 and 5,226,321 exemplify such gyroscopes.

Capacitive transducers have to be manufactured near the side surfaces of the ring by placing an electrode at a distance from the side surface, so that a voltage applied between the ring and the electrode is able to deform the ring (in the primary mode), or that the deformation of the ring (in the secondary mode) can be measured by the capacitance between the ring and the electrode. Electromagnetic excitation of the primary mode requires conductors formed on the top surface of the ring which impart a force to the ring when it is placed in an external magnetic field produced by a permanent magnet.

In these gyroscopes the detection capacitances are very small since it is very difficult to manufacture air gaps smaller than 1 µm, and the high amplitude of the primary oscillation puts limits on how far from the nodal points the secondary mode detection electrodes can be extended. On the other hand, the excitation capacitors needed for the primary mode must have a large gap to allow large amplitude oscillation, and thus the electrostatic force generated by these capacitors remains very small. If electromagnetic excitation is used, there is no space for multi-turn conductors on the ring, and a strong and large permanent magnet therefore has to be used. Such devices are typically not compatible with the standard packaging requirements of silicon devices.

BRIEF DESCRIPTION OF THE DISCLOSURE

An object of the present disclosure is to provide an apparatus which alleviates the above disadvantages.

The objects of the disclosure are achieved by an arrangement which is characterized by what is stated in the independent claims. The preferred embodiments of the disclosure are disclosed in the dependent claims.

The disclosure is based on the idea of utilizing piezoelectric transducers for exciting the primary resonance mode in the ring gyroscope and for detecting the secondary resonance mode. Furthermore, the disclosure describes how the resonance properties of the device can be changed by fastening additional mass elements to the ring with narrow bridge connectors, and how the ring can be suspended.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 2:
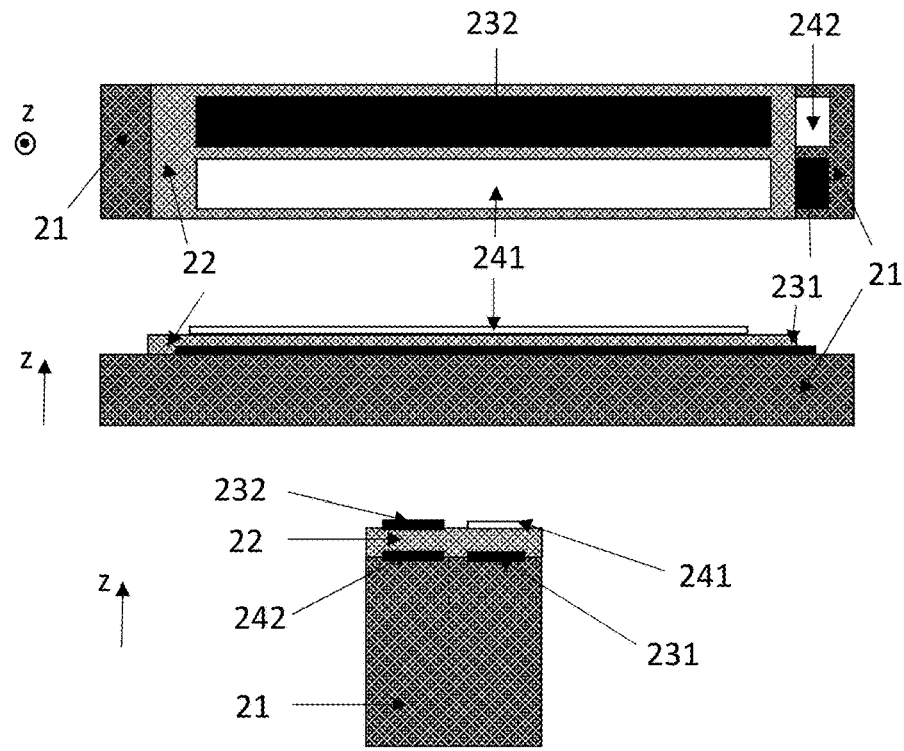
FIG. 2 illustrates three cross-sections of a bending piezoelectric transducer placed on a gyroscope ring.

FIG. 2 illustrates three cross-sections of a bending piezoelectric transducer placed on a gyroscope ring. The transducer can generate or measure bending motion in the xy-plane. A pair of first electrode layers 241 and 242 have been placed on silicon ring 21, one on the upper side of a layer of piezoelectric material 22 and one on the lower side (up and down refers in this case to the direction of the z-axis). These electrodes are paired with second electrode layers 231 and 232, respectively, as illustrated in the figure. Layers 241, 22 and 231 together form a first piezoelectric transducer on top of the ring 21, and layers 242, 22 and 232 together form a second piezoelectric transducer on top of the ring 21.

If drive voltages with opposite polarity are applied to these two transducers, the two transducers produce opposite strains in the xy-plane, which can deform silicon ring 21. If the transducers are used as sense transducers, in-plane bending will generate a voltage differential between the two transducers.

The drawing conventions of FIG. 2 will be employed throughout this disclosure to illustrate piezoelectric transducers. In other words, two parallel rectangles of opposite colour will be used to indicate a piezoelectric transducer. For simplicity, these two parallel rectangles will primarily be referred to in the singular, as a single "split transducer", even though the structure is actually a construction which comprises two transducers. In other words, a split transducer must comprise two parallel transducers.

Black and white colours indicate transducer polarity. The ordering of the black and white rectangles in a split transducer indicate polarity so that the polarity of a transducer with a white rectangle on the outer side of the ring is opposite to the polarity of a transducer with a black rectangle on the black rectangle on the outside of the ring (as seen in the same figure).

The piezoelectric layer 22, which may be an aluminium nitride (AlN) layer, is typically not thicker than a few micrometers. The thickness of the silicon ring 21 may, for example, be between 4-100 µm, preferably between 10-50 µm.

When piezoelectric transducers described in this disclosure are used in the sense mode, the largest output voltage between the electrodes of the transducer may be achieved when the transducer capacitance equals the sum of the capacitance of the external connections and the input capacitance of the amplifier. The capacitance of the transducer is determined by its area and by the thickness of the piezoelectric layer.

Figure 3:
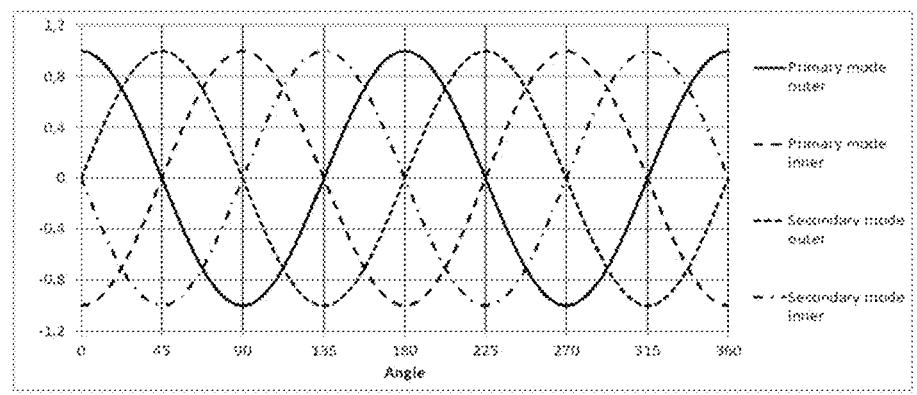
FIG. 3 illustrates the variation of tangential stress along the inner and outer perimeters of a gyroscope ring.

The primary and secondary oscillation modes produce mechanical stress on the inner and outer perimeter of the ring. The momentary stress varies as a sinusoidal function of length along the ring perimeter. The length variable is in this case represented by the clockwise angle with respect to the $T_2$-axis pointing in the positive y-direction in FIG. 1. FIG. 3 shows the variation of tangential stress along the inner and outer perimeters of the ring for both oscillation modes. At the illustrated moment, the stress varies as a sine-function of the angle for the primary mode and as a cosine-function for the secondary mode, and the stress on the inner perimeter is in each case equal but opposite to the stress on the outer perimeter. This stress distribution can be generated and detected by piezoelectric split transducers positioned on the top surface of the ring and lengthwise along the perimeter of the ring. A split transducer positioned on the ring for driving the primary oscillation will produce opposite and constant stress on each perimeter of the ring.

This disclosure describes a ring gyroscope which comprises a substantially circular and flexible ring which defines a ring plane, and which is flexibly suspended from a substrate so that the ring can undergo shape oscillation in the ring plane. The ring comprises first and second transversal symmetry axes in the ring plane which are orthogonal to each other, and the ring also comprises first and second diagonal symmetry axes in the ring plane which are orthogonal to each other, and the angle between each transversal symmetry axis and the adjacent diagonal symmetry axis is 45°. The gyroscope further comprises one or more primary piezoelectric split transducers configured to drive the ring into resonance oscillation, placed on first sectors of the ring, and one or more secondary piezoelectric split transducers configured to sense the oscillation of the ring, placed on one or more second sectors of the ring. Each first sector crosses a transversal symmetry axis of the ring and is symmetric with respect to that symmetry axis, and each second sector crosses a diagonal symmetry axis of the ring and is symmetric with respect to that diagonal symmetry axis of the ring.

The gyroscope also comprises a suspension structure configured to support the weight of the ring and the mass elements, wherein the suspension structure comprises N outer suspenders, where N is an integer greater than or equal to two, and each outer suspender extends along a ring tangent from a suspension attachment point on the outer edge of the ring to an anchor point. The suspension attachment points are substantially evenly distributed along the ring perimeter, and the ratio between the vertical thickness of each outer suspender in the direction perpendicular to the ring plane and the radial width of that outer suspender in the direction of the ring radius is at least 4.

In this disclosure, expressions such as "a piezoelectric split transducer placed on sector A of the ring" always mean that a piezoelectric split transducer is placed on top of the ring in sector A of the ring. FIG. 2 illustrates how split transducers may be placed on top of the ring.

The gyroscope may optionally comprise four or more mass elements which form a symmetrical mass distribution in relation to both the first and second transversal symmetry axes and to the first and second diagonal symmetry axes, wherein each mass element is attached to the ring from a bridge connector and the bridge connectors are evenly distributed along the ring.

This disclosure also describes a method for using a ring gyroscope described above, wherein the method comprises the steps of: applying to at least one primary piezoelectric split transducer a drive voltage signal to generate the primary oscillation mode in the ring gyroscope, and reading from at least one secondary piezoelectric split transducer a sense voltage signal to measure the oscillation amplitude of secondary oscillation in the ring gyroscope.

Figure 4:
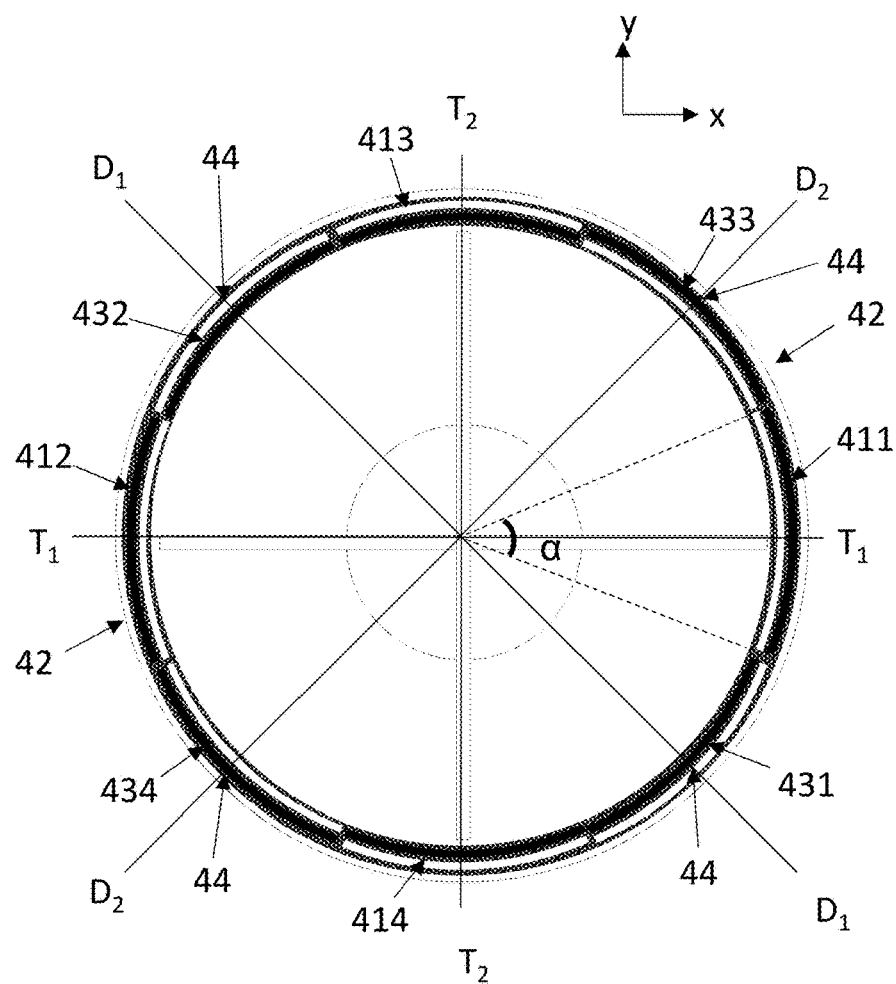
FIG. 4 illustrates a ring gyroscope.

The same method can be employed with any ring gyroscope described in this disclosure. FIG. 4 illustrates a ring gyroscope which comprises a ring 42. The planar ring defines the ring-plane which corresponds to the xy-plane in FIG. 4. The suspension arrangement is not illustrated. The first and second transversal symmetry axes $T_1$ and $T_2$, and the first and second diagonal symmetry axes $D_1$ and $D_2$ correspond to the symmetry axes discussed above with reference to FIG. 1. At least one primary piezoelectric split transducer 411 has been placed on the ring 42. This split transducer 411 covers a first sector of the ring which corresponds to the angle α, as illustrated in FIG. 4. The midpoint of this sector (or, equivalently, the midpoint of the transducer 411) defines the direction of first transversal symmetry axis $T_1$. An alternating drive voltage applied to split transducer 411 will alternately stretch and compress the ring 42 along transversal symmetry axis $T_1$.

In other words, since a circle has infinitely many symmetry axes, the direction of the first symmetry axis can be freely selected by the placement of the first primary split transducer 411. Once the first axis $T_1$ has been defined, the other three symmetry axes $T_2$, $D_1$ and $D_2$ have also already been uniquely defined, and the placement of subsequent primary and secondary split transducers on the ring must conform to the following requirements:

1. A second primary piezoelectric split transducer 412 may optionally be placed opposite to 411, on the other side of the ring. The midpoint of this second primary split transducer 412 must lie as close as possible to the first transversal symmetry axis $T_1$. In other words, split transducer 412 defines another first sector of the ring which must cross the transversal symmetry axis $T_1$ of the ring and be symmetric with respect to that axis. In this context, symmetry means that the sector extends equally far on both sides of the axis $T_1$. Since the second split transducer 412 illustrated in FIG. 4 has the same polarity symmetry with respect to the center of the ring as the first split transducer 411, the drive voltage signal applied to transducer 412 should have the same phase as the drive voltage signal applied to transducer 411. The drive oscillations induced by these two split transducers will then reinforce each other. If the polarity of the second split transducer 412 with respect to the center of the ring would be opposite to the polarity of transducer 411, the drive voltage signals should exhibit a phase difference of 180°.

2. Third and fourth primary piezoelectric split transducers 413 and 414 may optionally be placed on opposite sides of the ring. Their positions are shifted from the positions of first and second primary piezoelectric split transducers 411 and 412 by 90°. The midpoints of these third and fourth primary split transducers 413 and 414 must lie as close as possible to the second transversal symmetry axis $T_2$. In other words, split transducers 413 and 414 define additional first sectors of the ring which must cross the transversal symmetry axis $T_2$ of the ring and be symmetric with respect to that axis. Since the third and fourth split transducer 413 and 414 illustrated in FIG. 4 have the opposite polarity symmetry with respect to the center of the ring as the first split transducer 411, the drive voltage signal applied to split transducers 413 and 414 should have the same phase as the drive voltage signal applied to transducer 411. The ring will then be driven to contract along axis $T_2$ when it expands along axis $T_1$, and vice versa. If either one or both of split transducers 413 and 414 would have the same polarity as 411, then that transducer can be driven with a drive voltage signal which has been shifted 180° in relation to the signal applied to transducer 411.

3. One to four secondary piezoelectric split transducers 431-434 may be placed on four sides of the ring, each shifted from the adjacent secondary split transducers by an angle of 90°. The midpoints of these secondary split transducers 431-434 must lie as close as possible to the either the first diagonal symmetry axis $D_1$ or the second diagonal symmetry axis $D_2$. As explained above, these diagonal symmetry axes are shifted from the transversal symmetry axes by an angle of 45°. Each secondary split transducer 431-434 defines a second sector of the ring. Each second sector must cross a diagonal symmetry axis of the ring and be symmetric with respect to that axis. As before, symmetry in this context means that the sector extends equally far on both sides of the diagonal symmetry axis. The polarity of the secondary split transducers with respect to the center of the ring may chosen freely. FIG. 4 illustrates the simplest alternative where the polarity of secondary split transducers 431 and 432, which cross the first diagonal symmetry axis $D_1$, is opposite to the polarity of secondary split transducers 433 and 434, which cross the second diagonal symmetry axis $D_2$. Since expansion along $D_1$ is always accompanied by contraction along $D_2$ and vice versa, the sense voltages obtained from all secondary split transducers 431-434 can in this case be joined directly together.

In other words, at least one primary piezoelectric split transducer should be present on the ring to excite the primary resonance motion of the ring. This excitation is achieved by applying an alternating voltage to the primary piezoelectric split transducer, with a frequency which is equal or close to the resonance frequency of the ring. The primary piezoelectric split transducers should preferably be placed symmetrically in relation to a transversal symmetry axis of the ring.

Additionally, at least one secondary piezoelectric split transducer should be present on the ring to detect the oscillation coupled by the Coriolis force when the ring rotates about its central axis which is perpendicular to the ring plane. The secondary piezoelectric split transducers should preferably be placed symmetrically in relation to a diagonal symmetry axis of the ring.

Misalignment of any first or second sector (i.e. any primary or secondary transducer) will induce unwanted coupling of primary oscillation into the secondary oscillation mode. This is a because a misaligned primary transducer 411-414 will generate oscillation which puts the adjacent nodal point 44 in motion, even though the nodal points 44 should remain stationary when the ring oscillates only in the primary resonance mode. The oscillation of the nodal point 44 will be picked up by secondary split transducers 431-434 and create an erroneous sense signal. Conversely, a misaligned secondary transducer will be centered at a point which differs from the nodal point 44, which also leads it to pick up the primary resonance oscillation and to produce an erroneous sense signal. If, on the other hand, all primary and secondary split transducers are perfectly aligned, then secondary split transducers 431-434 will only pick up the true secondary resonance mode, which is the oscillation of nodal points 44 induced by the Coriolis force.

A single primary piezoelectric split transducer on a first sector of the ring and a single secondary split transducer on a second sector of the ring is sufficient for operating the ring gyroscope. However, to improve the signal-to-noise ratio and reduce the possibility of errors due to misalignment, the number of both primary and secondary split transducers may be increased according to geometry illustrated as illustrated in FIG. 4.

In other words, the gyroscope may comprise a first pair of primary piezoelectric split transducers 411, 412 on two first sectors which cross the first transversal symmetry axis $T_1$ on opposite sides of the ring 42. Optionally, the gyroscope may also comprise a second pair of primary piezoelectric split transducers 413, 414 on two first sectors which cross the second transversal symmetry axis $T_2$ on opposite sides of the ring 42. The first pair of primary piezoelectric split transducers 411, 412 may have a polarity-symmetry with respect to the center of the ring 42 which is opposite to the polarity-symmetry of the second pair of piezoelectric split transducers 413, 414 with respect to the center of the ring 42.

Furthermore, the gyroscope may comprise a first pair of secondary piezoelectric split transducers 431, 432 on two second sectors which cross the first diagonal symmetry axis $D_1$ on opposite sides of the ring 42. Optionally, the gyroscope may also comprise a second pair of secondary piezoelectric split transducers 433, 434 on two second sectors which cross the second diagonal symmetry axis $D_2$ on opposite sides of the ring 42. The first pair of secondary piezoelectric split transducers 431, 432 may have a polarity-symmetry with respect to the center of the ring 42 which is opposite to the polarity-symmetry of the second pair of secondary piezoelectric split transducers 433, 434 with respect to the center of the ring 42.

In the ring gyroscope illustrated in FIG. 4, the width of each first sector and each second sector is 45°. In other words, the length of each primary split transducer 411-414 and the length of each secondary split transducer 431-433 is equal to ⅛ of the ring circumference. In FIG. 4, where there are eight split transducers in total, the primary and secondary split transducers together cover the entire circumference of the ring. This maximizes the force obtained from the primary transducers and the sense signal strength obtained from the secondary transducers.

However, sometimes some of the area on the top surface of the ring may be needed for other purposes than force transduction, for example drive amplitude monitoring, coupling cancellation or electrical contacting.

Figure 5:
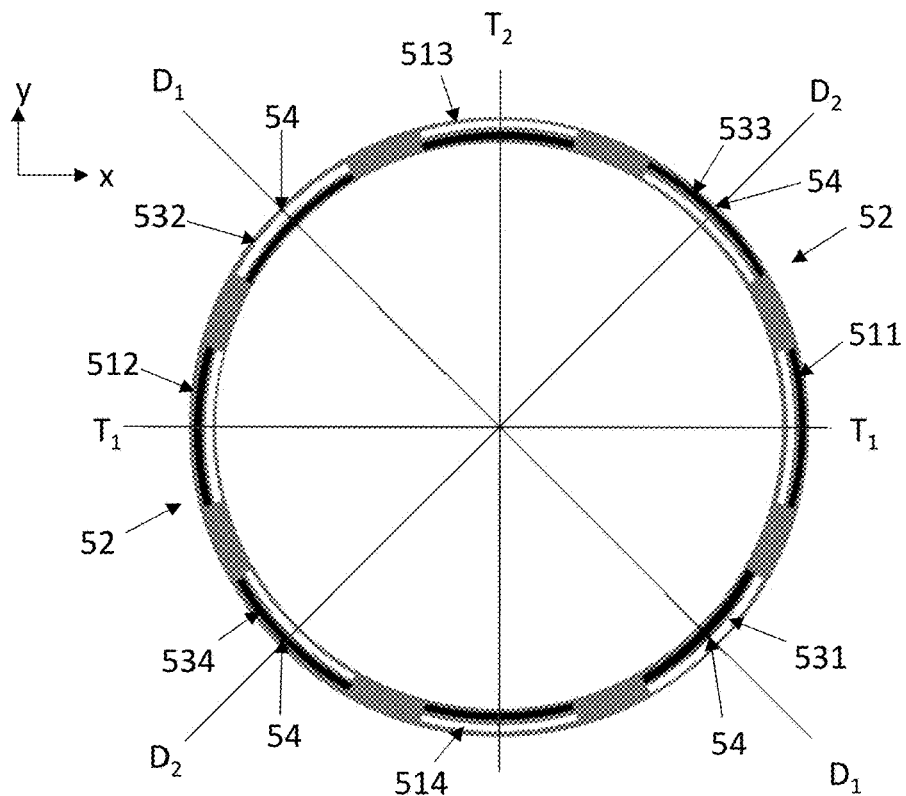
FIG. 5 illustrates a transducer embodiment.

FIG. 5 illustrates a ring gyroscope according to another transducer embodiment. Reference numbers 511-514, 531-534, 52 and 54 correspond to reference numbers 411-414, 431-434, 42 and 44, respectively in FIG. 4. In FIG. 5, the width of each first sector is less than 45°, and the width of each second sector is less than 45°. For illustrative purposes the length of each transducer is 1/16 of the ring circumference, so that the corresponding width of each first and second sector is 22.5°, but transducer lengths can be selected freely. The symmetry criterion remains the same as in FIG. 4: each first and second sector should be symmetric with respect to the symmetry axis which it crosses. Deviations from this symmetry will cause unwanted coupling of primary mode oscillation into the secondary mode, as described above.

Figure 6:
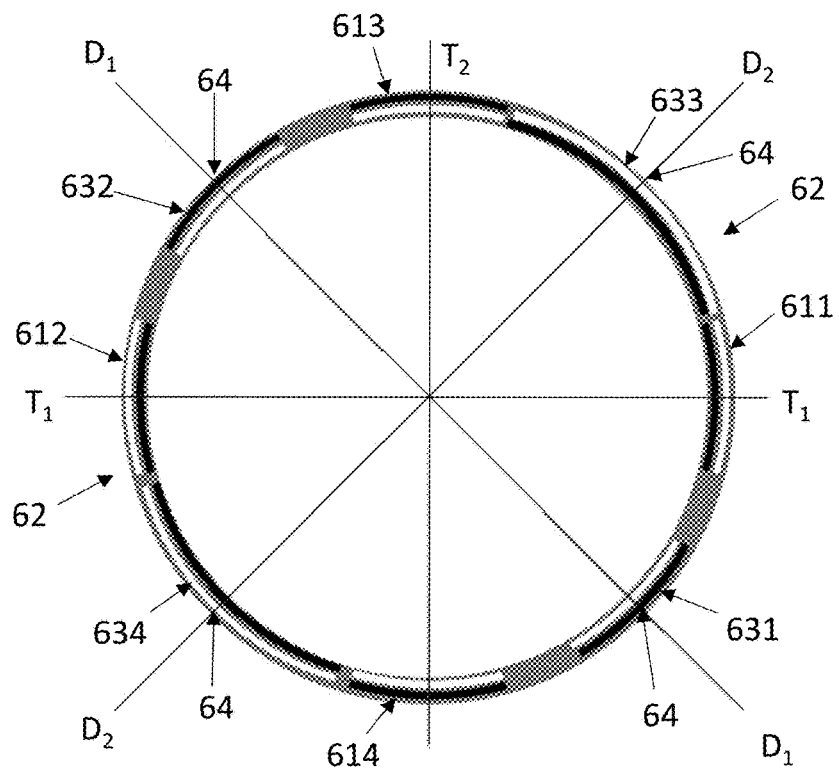
FIG. 6 also illustrates a transducer embodiment.

FIG. 6 illustrates an alternative transducer embodiment where the width of all first sectors and two second sectors is less than 45°, and the width of the two other second sectors is 45°. Reference numbers 611-614, 631-634, 62 and 64 correspond to reference numbers 511-514, 531-534, 52 and 54, respectively, in FIG. 5. Alternatively, the width of each first sector may be less than 45°, and the width of each second sector may be 45°. These configurations, which open up some room on the ring surface by narrowing the first sectors, can be advantageous when driving force can be sacrificed but sense signal strength cannot. The force required for driving the primary oscillation depends on the dimensions of the ring, the length of the primary transducers and the amplitude of the drive voltage signal applied to these primary transducers. As before, each first and second sector must still be symmetric with respect to the symmetry axis which it crosses.

When the ring gyroscope is used in closed-loop servo mode, or when the secondary mode resonance is damped by closed loop feedback, at least one secondary piezoelectric split transducer may be driven with an alternating voltage so that it actively cancels the coupling of the primary oscillation into the secondary. The lengths of the secondary transducers which are dedicated to active cancelling may then differ from the lengths of the secondary transducers which sense the secondary oscillation.

Alternatively, the width of each first sector may be 45°, and the width of each second sector may be less than 45°. This configuration can be advantageous for freeing space on the ring when the driving force must be maximized, but some of the sense signal strength can be sacrificed. This option is not separately illustrated, but it corresponds directly to FIG. 6, except that each primary split transducer would cover ⅛ of the ring circumference, while no secondary split transducer would cover that much of the circumference.

All primary split transducers do not necessarily have to be used for driving the primary oscillation. Some of them may, for example, be used for measuring the amplitude of the primary oscillation. This is needed for maintaining stable oscillation amplitude independent of the changes in the driving frequency or the Q-value of the resonator due to environmental variables or aging.

In other words, a method for using any ring gyroscope described in this disclosure may comprise the step of reading from at least one primary piezoelectric split transducer a third voltage signal to measure the oscillation amplitude of primary oscillation in the ring gyroscope.

Similarly, all secondary split transducers do not necessarily have to be used for measuring the secondary oscillation. Some of them may, for example, be used for active interventions into the secondary oscillation mode. For example, when the ring gyroscope is used in closed-loop servo mode, or when the secondary mode resonance is damped by closed loop feedback, or when an applied electromechanical force is used to cancel a quadrature signal, at least one secondary piezoelectric split transducer may be driven with an alternating voltage so that it actively cancels the coupling of the primary oscillation into the secondary oscillation. The lengths of the secondary transducers which are dedicated to active cancelling may differ from the lengths of the secondary transducers which sense the secondary oscillation.

In other words, a method for using any ring gyroscope described in this disclosure may comprise the step of applying to at least one secondary piezoelectric split transducer a fourth voltage signal to actively cancel the coupling of the primary oscillation into the secondary oscillation.

Figure 7:
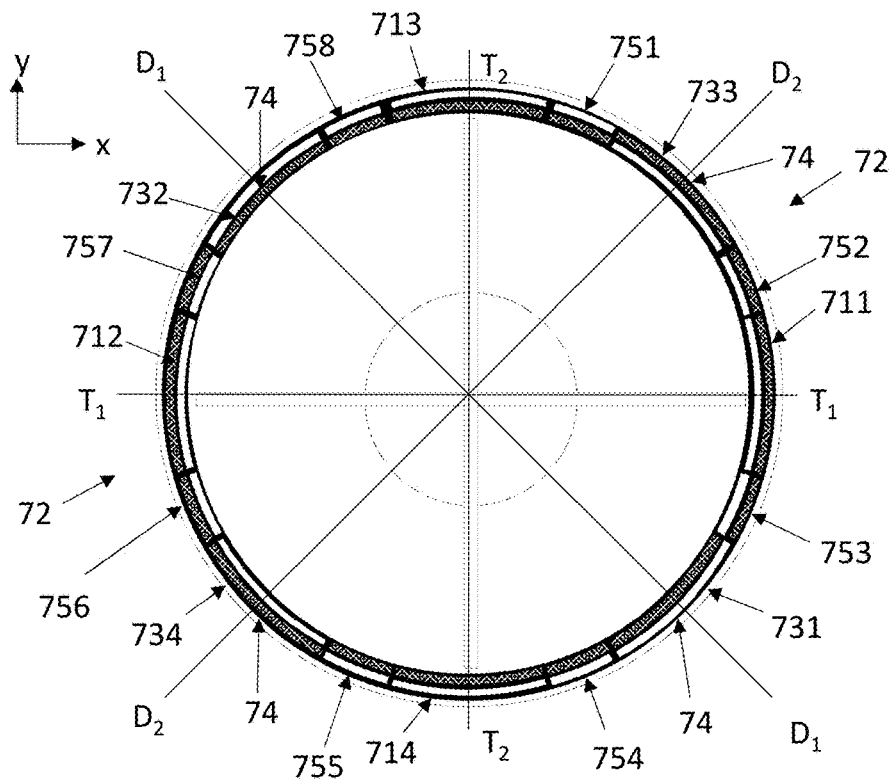
FIG. 7 also illustrates a transducer embodiment.

If the primary and secondary split transducers do not together cover the entire circumference of the ring, the vacant surface area (for example, the unused area on the ring in FIGS. 5 and 6) can be used for other purposes. FIG. 7 illustrates an alternative embodiment where reference numbers 711-714, 731-734, 72 and 74 correspond to reference numbers 611-614, 631-634, 62 and 64, respectively, in FIG. 6. In this embodiment, the width of at least one first or second sector is less than 45°. The gyroscope comprises one or more tertiary piezoelectric split transducers on third sectors of the ring, which do not overlap with the first sectors or the second sectors.

Eight tertiary piezoelectric split transducers 751-758 are illustrated in FIG. 7. The number of tertiary piezoelectric split transducers could be smaller, and it may depend on the widths of the primary and secondary transducers. The number of tertiary piezoelectric split transducers may also be larger than eight. Several third sectors may fit between first and second sectors.

One or more of the tertiary piezoelectric transducers 751-758 may be used for detecting the amplitude of the primary oscillation. This amplitude may not remain constant during the lifetime of the device due to temperature stress and other aging effects. Drift in the drive amplitude will immediately introduce a proportional error in the sensed amplitude, but this error can be corrected if the primary oscillation is monitored.

In other words, a method for using a ring gyroscope which comprises one or more tertiary piezoelectric split transducers on third sectors of the ring which do not overlap with the first sectors or the second sectors may comprise the step of reading from at least one tertiary piezoelectric split transducer a fifth voltage signal to measure the oscillation amplitude of primary oscillation in the ring gyroscope.

One or more of the tertiary piezoelectric transducers 751-758 may also be used for cancelling coupled oscillation when the gyroscope is used in closed loop servo mode or when the secondary resonance mode is actively damped by closed-loop feedback, or when electromechanical force is used to cancel a quadrature signal, as described above.

In other words, a method for using a ring gyroscope which comprises one or more tertiary piezoelectric split transducers on third sectors of the ring which do not overlap with the first sectors or the second sectors may comprise the step of applying to at least one tertiary piezoelectric split transducer a sixth voltage signal to actively cancel the coupling of the primary oscillation into the secondary oscillation.

Figure 8:
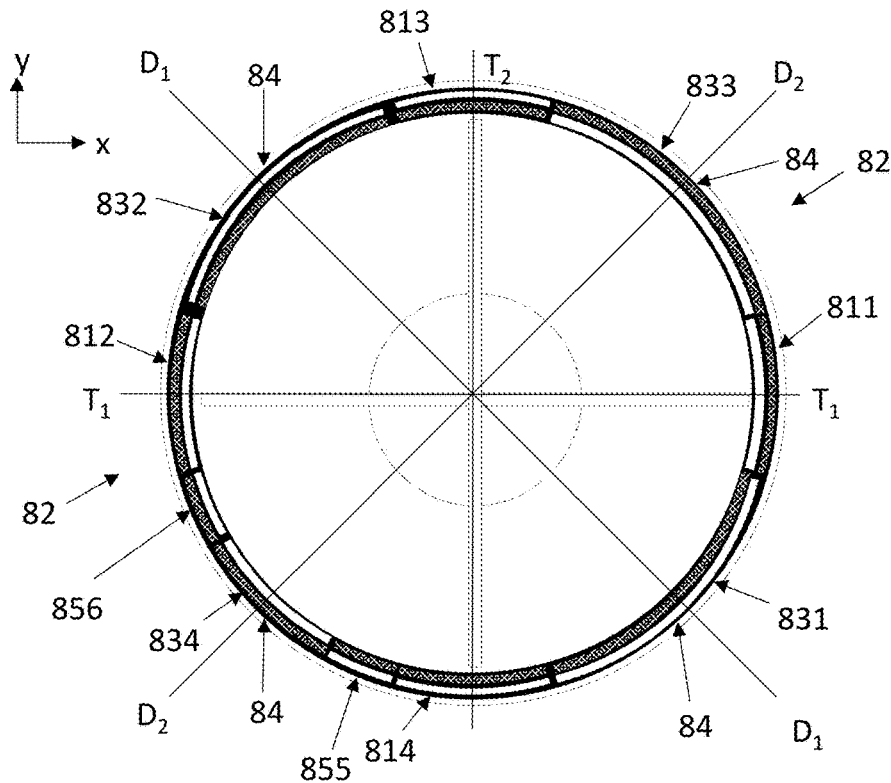
FIG. 8 also illustrates a transducer embodiment.

FIG. 8 illustrates an alternative embodiment where reference numbers 811-814, 831-834, 855-856, 82 and 84 correspond to reference numbers 711-714, 731-734, 755-756, 72 and 74, respectively, in FIG. 7. In this embodiment, three of the secondary transducers on the second sectors, 831-833, have a width larger than 45°, and the fourth one, 834, has a width less than 45°. All of these secondary transducers are used for detecting the secondary oscillation. All transducers on the primary sectors, 811-814, have a width less than 45°, and they are used for exciting the primary oscillation. There are only two tertiary transducers on third sectors, 855 and 856. One of these tertiary transducers is used for detecting the amplitude of the primary oscillation, as described above. The other is used for cancelling coupled oscillation when the gyroscope is used in closed loop servo mode or when the secondary resonance mode is actively damped by closed-loop feedback, or when electromechanical force is used to cancel a quadrature signal, as described above.

As indicated visually in FIG. 8, the whole perimeter of the ring may be fully covered by transducers for the described functions. The gyroscope may be optimized by selecting optimum transducer lengths for each function, so that sufficiently high signal-to-noise ratios for the primary and secondary signals while keeping the voltages for driving the primary oscillation and for compensating the secondary oscillation by applied electromechanical force suitably low.

Certain design tradeoffs may be required when piezoelectric transducers are fabricated on the top surface of the ring.

A practical split electrode transducer requires at least 15 μm, preferably more than 20 μm of width. A silicon ring with an outer diameter of 1000 μm and a width 6.8 μm has a 30 kHz resonant frequency, but it is nearly impossible to manufacture piezoelectric split-transducers on the top surface of such a narrow ring.

In order to implement piezoelectric transduction on a basic gyroscope ring, the width of the ring must be increased. This increases the resonance frequency. A ring width of 15 μm increases the resonance frequency to 67 kHz. But even this may be too narrow, because the total maximum capacitance of a 15 μm wide split transducer with a 1 μm AlN layer is only 3.8 pF, which will be shared with many functions in addition to sensing the secondary oscillation: e.g. driving the primary oscillation, sensing the magnitude of the primary oscillation and driving a compensating signal in the secondary mode to cancel the secondary oscillation in a closed feed-back loop and/or damping the secondary resonance and/or cancelling the quadrature signal. For perfect match to the surrounding electronics, the total capacitance should preferably be 7-15 pF since it is not easy to use more than 50% of the maximum capacitance for sensing the secondary oscillation.

Increasing ring width to 30 μm makes the capacitance 7.6 pF, but the corresponding resonance frequency is then 140 kHz. At high frequency operation the gyroscope becomes more immune to external vibrations, which are predominantly at lower frequencies, but the quadrature signal due to direct mechanical coupling of the primary mode to the secondary transducers also increases with frequency.

An obvious way to increase the width of the ring and the capacitance without too much increasing the resonant frequency is to increase the diameter of the ring. If the diameter is chosen 1.6 mm and the width 18 μm the resonant frequency will be 31 kHz and the capacitance 7.2 pF which numbers are close to an ideal target. But this gyroscope will have 2.5 times as large area and thus 2.5 times as large manufacturing cost as the 1 mm diameter gyroscope.

These design tradeoffs can be alleviated by fastening additional mass elements to the ring. These mass elements may be shaped like partial circle sectors inside the ring or like corner elements with perpendicular sides outside of the ring. Other shapes are also possible, as described below. These additional mass elements cannot be attached to the ring from fasteners which cover a large proportion of the ring perimeter, because it will lead to a loss of elastic flexibility in the ring. However, if each mass is attached to the ring from a fastener shaped like a narrow bridge, the elasticity of the ring and its spring constant (i.e. force/deformation ratio) can be maintained even when a significant amount of additional mass is added to the oscillating system. Since the resonant frequency depends on the spring constant/mass ratio, the additional mass elements can be used to reduce the resonance frequency of the system without having to use an excessively narrow ring.

Figure 9A:
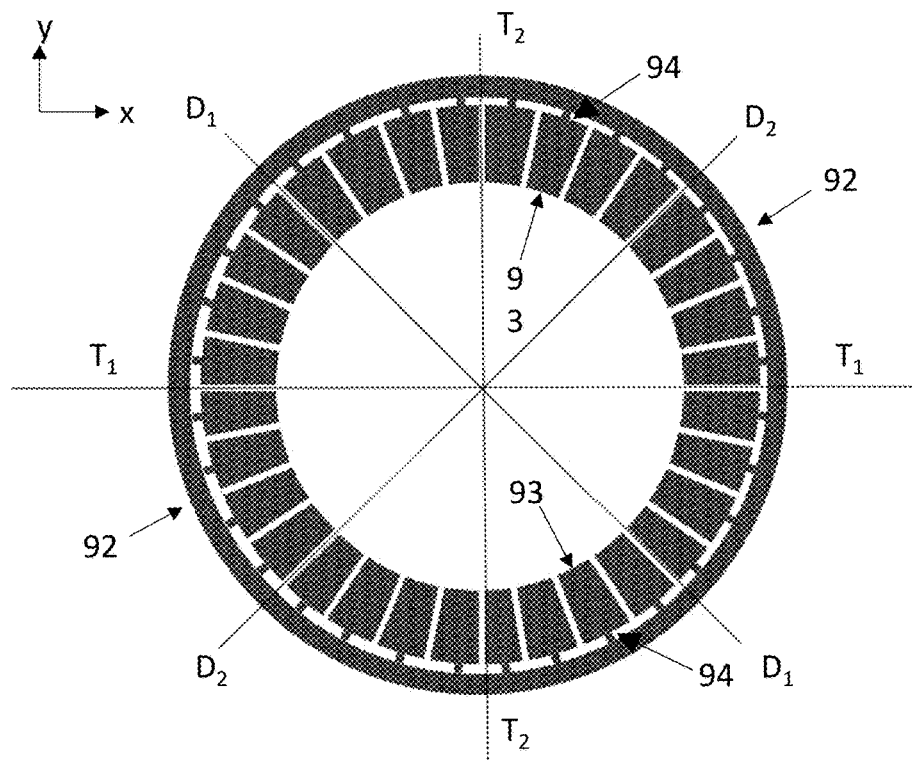
FIGS. 9a-9c illustrate ring gyroscopes.

FIG. 9a illustrates an exemplary ring gyroscope according to one embodiment. Piezoelectric transducers have been omitted from the figure to preserve clarity, but any of the transducer embodiments described above can be implemented with any of the embodiments described in this disclosure. In other words, reference number 92 in FIG. 9a may correspond to any of the reference numbers 42, 52, 62 or 72 from the preceding figures. FIG. 9a shows a ring 92 with 32 small mass elements 93, all of which are located inside the ring. Each mass element 93 is shaped like a partial circle sector within the ring, but other shapes may also be used.

Each mass element 93 is attached to the ring from a bridge connector 94. The width of a bridge connector along the ring periphery is substantially less than the width of the corresponding mass element 93 along the ring periphery to ensure that the flexibility of the ring is affected as little as possible by the mass elements which have been added to the ring. The bridge connector 94 must nevertheless be sufficiently wide to support the weight of the mass element 93. The minimum width therefore depends on the size of the mass element. In the vertical z-direction perpendicular to the xy-plane the bridge connector 94 may be as high the mass element 93 and the ring 92, because the in-plane flexibility of the ring 92 does not depend on the vertical height of the bridge connector 94. The radial length of the bridge connector 94 should be as small as possible, limited by the required clearance between the ring and the mass element to allow large amplitude primary oscillation and by manufacturing tolerances. The radial length should be small enough so that any bending of the bridge connector is negligible compared to the elastic deformation of the ring in the primary and secondary oscillation modes.

Figure 1:
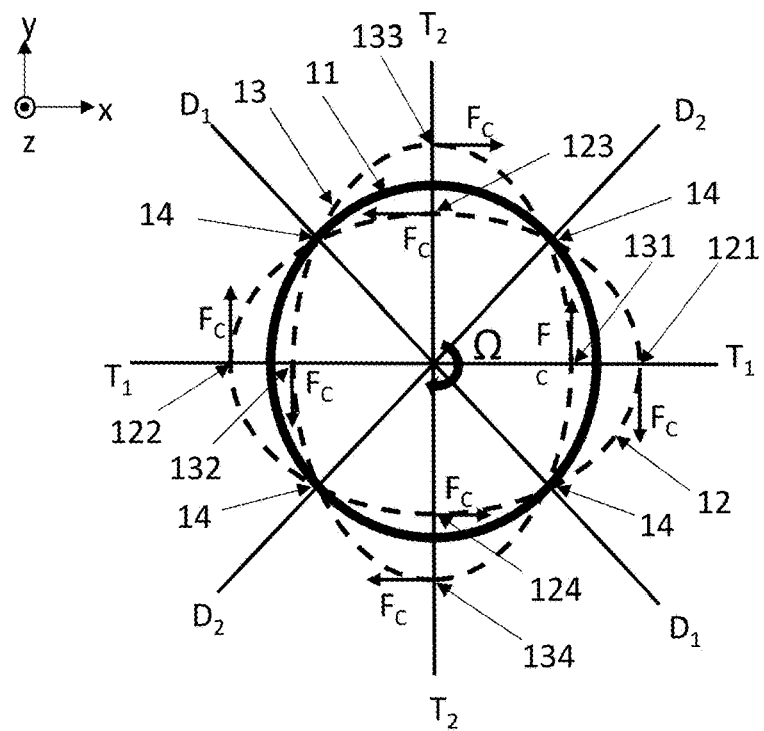
FIG. 1 illustrates the primary and secondary modes in an oscillating ring gyroscope.

The mass distribution produced by the sum of all mass elements 93 must be symmetric in relation to both the first and second transversal symmetry axes $T_1$ and $T_2$ and to the first and second diagonal symmetry axes $D_1$ and $D_2$ in order to maintain the two elliptical resonance modes of the ring at 45° angle as shown in in FIG. 1 and explained above, and not to introduce any other low order in-plane resonance modes. This is needed to maintain the basic benefits of a ring gyroscope: to achieve a high Q-value of the resonance without any oscillation energy leaking out and to achieve good robustness to external linear and angular vibrations.

Figure 9B:
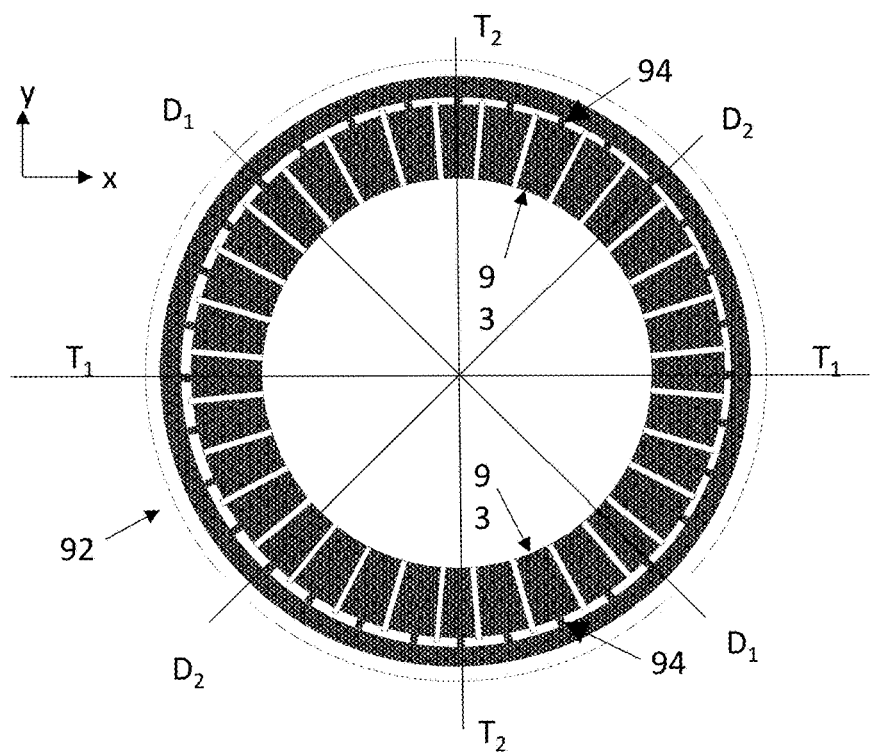

1. There are many ways to preserve the required symmetry. The configuration illustrated in FIG. 9a can more generally be described as a configuration where the number of mass elements is 4N, where N is an integer greater than zero, and the mass elements are distributed symmetrically with respect to both the transversal and diagonal symmetry axes. In FIG. 9a, the number of mass elements is 32, and no mass element crosses a symmetry axis. FIG. 9b illustrates a ring gyroscope with 32 elements where every fourth mass element crosses a symmetry axis.

Figure 9C:
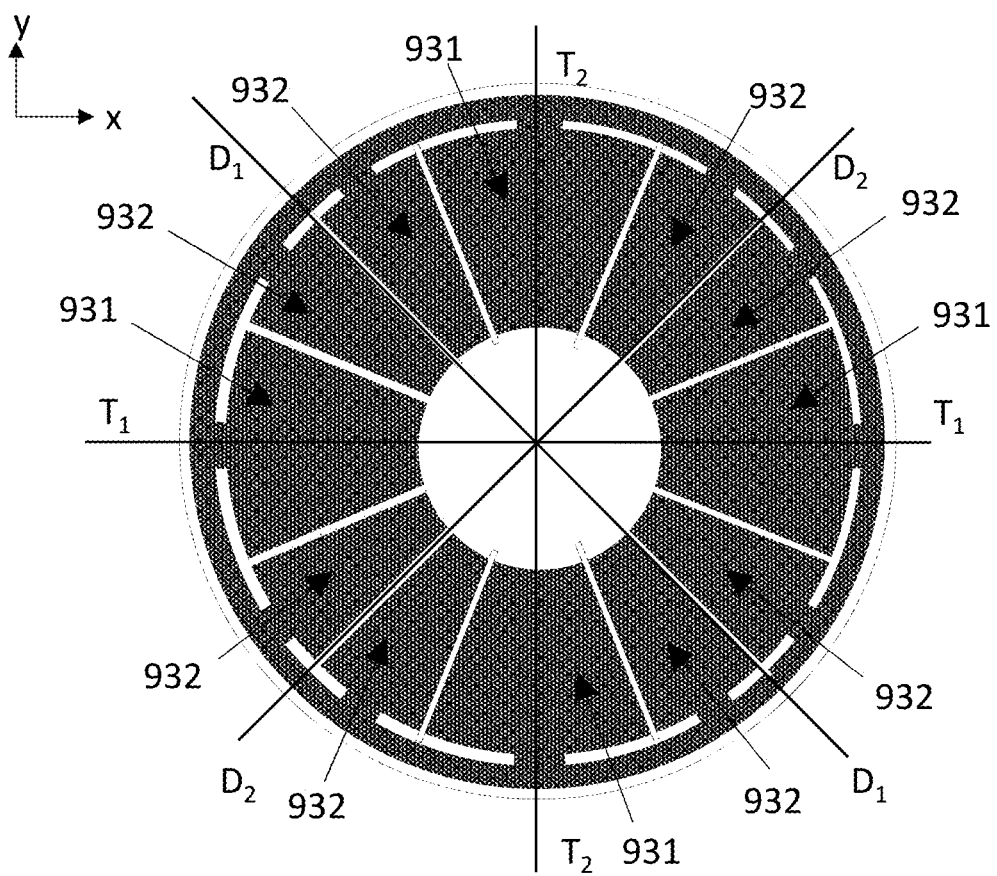

2. The mass elements do not necessarily have to be of equal size. FIG. 9c illustrates a configuration with four larger mass elements 931 and eight smaller mass elements 932. The mass elements are nevertheless distributed symmetrically with respect to all symmetry axes.

It can be showed that in a ring with no mass elements attached, the effective moving mass for one oscillation mode is 29.7% of the total ring mass. With the additional mass elements 93 in FIGS. 9a and 9b, the moving mass is considerably increased without affecting the spring constant of the ring. If the radial length of the mass elements in FIG. 9a or 9b is 200 μm, a ring width of 20 μm can produce a resonant frequency at 30 kHz. Without the added mass elements 93, the resonant frequency of the 20 μm wide ring would be 91 kHz.

Looking at it from another perspective, with the additional mass elements the effective moving mass in one oscillation mode becomes 25 times larger than the effective mass in one oscillation mode when only a 6.8 μm wide ring (suitable for producing a resonance frequency of 30 kHz) is used. In other words, 25 times the original oscillation energy is stored in the resonating system when these additional mass elements are used, which results in an output signal amplitude which is 5 times greater than the original maximum output signal. The total capacitance of the 20 μm wide set of transducers would be 4.9 pF if 1 μm AlN is used.

If the desired resonance frequency would be 50 kHz, a bare ring without mass elements would have to be only 11 μm of wide to achieve the desired frequency. This is too narrow for a piezoelectric transducer. Assuming again that the radial length of the mass elements 93 in FIGS. 9a and 9b would be 200 μm, the presence of the mass elements increases the available width to 28 μm while still maintaining the resonant frequency at 50 kHz. The energy of the oscillation is in this case increased by a factor of 16, and the signal amplitude by a factor of 4, compared to the gyroscope without added mass elements. The total transducer capacitance is increased to 6.8 pF. If the radial length of the mass elements 93 is increased to 370 μm, the ring width can be increased to 31 μm at 50 kHz resonant frequency. The total capacitance will then be 7.5 pF.

If the ring diameter is approximately 1000 μm, a suitable radial length of the mass elements may, for example, be in the range 50-500 μm, 100-400 μm, or 200-300 μm. The ring width may, for example, be 15-50 μm, 20-40 μm or 25-35 μm. If the ring diameter is larger than 1000 μm, the radial length of the mass elements and the ring width may be increased in the same proportion.

Although the distribution of mass elements which is illustrated in FIGS. 9a and 9b increases the oscillating mass in the ring gyroscope, the whole of the added mass is not fully contributing to the moving mass of the oscillating mode. The primary oscillation of the ring will move the mass elements radially. But the amount of radial motion is reduced at locations away from the primary axes. At the location on the perimeter at 45° angle from the primary axis there will be no radial motion at all. The oscillation will also bend the bridge connectors to some extent, because all portions of the ring perimeter which are not located precisely on a crossing point with a symmetry axis will undergo a rotation in addition to the radial movement. At the location on the perimeter at 45° angle from the primary axis, there will be only a rotation. This rotation will bend the bridge connector slightly, swing the attached mass sideways and introduce an additional tangential motion in addition to the radial motion of the mass elements. The radial component of the motion is, however, much reduced for mass elements away from the primary axes and is zero at 45° angle and thereby the attached mass elements away from the primary axes are not fully contributing to the moving mass of the oscillation although the tangential motion may to some extent compensate for the reduced radial motion, especially if the mass elements are radially rather long.

Figure 10A:
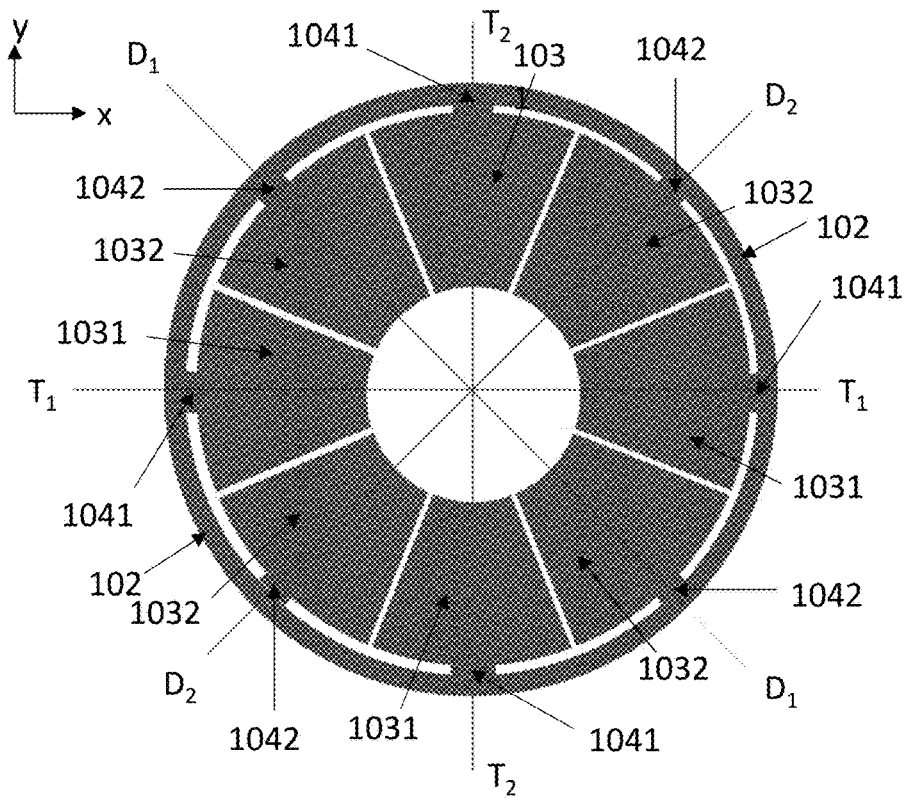
FIGS. 10a-10e illustrate ring gyroscopes.

FIGS. 10a-10e illustrate exemplary ring gyroscopes according to an alternative embodiment. In this embodiment, the size of the mass elements has been increased, and their number decreased. FIG. 10a illustrates an embodiment where all mass elements 1031 and 1032 are located inside the ring. The number of mass elements is eight, and each mass element is placed so that it crosses one symmetry axis, so that it is symmetric in relation to that symmetry axis, and so that its bridge connector is centered on that symmetry axis.

The ring gyroscope in FIG. 10a comprises four mass elements 1031 which cross a transversal symmetry axis, and four mass elements 1032 which cross a diagonal symmetry axis. The mass elements 1031 are attached to the ring 102 with bridge connectors 1041 which cross the same transversal symmetry axis as the mass element. The mass elements 1032 are attached to the ring 102 with bridge connectors 1042 which cross the same diagonal symmetry axis as the mass element. Due to the greater size of the mass elements 1031 and 1032 compared to mass elements 93, the bridge connectors 1041 and 1042 also have to be wider than bridge connectors 94 in FIGS. 9a and 9b.

In the mass element distribution illustrated in FIG. 10a, mass elements 1031 will move back and forth along the transversal symmetry axes $T_1$ and $T_2$ in drive oscillation. When sense oscillation occurs, mass elements 1032 will correspondingly move back and forth along the diagonal symmetry axes $D_1$ and $D_2$. The best signal-to-noise ratio is typically obtained when the resonance frequency of the primary mode equals the resonance frequency of the secondary mode. This balance is obtained in the configuration in FIG. 10a when each mass element occupies an equally wide partial circle sector. The width of each partial circle sector may for example be 45°.

Figure 10B:
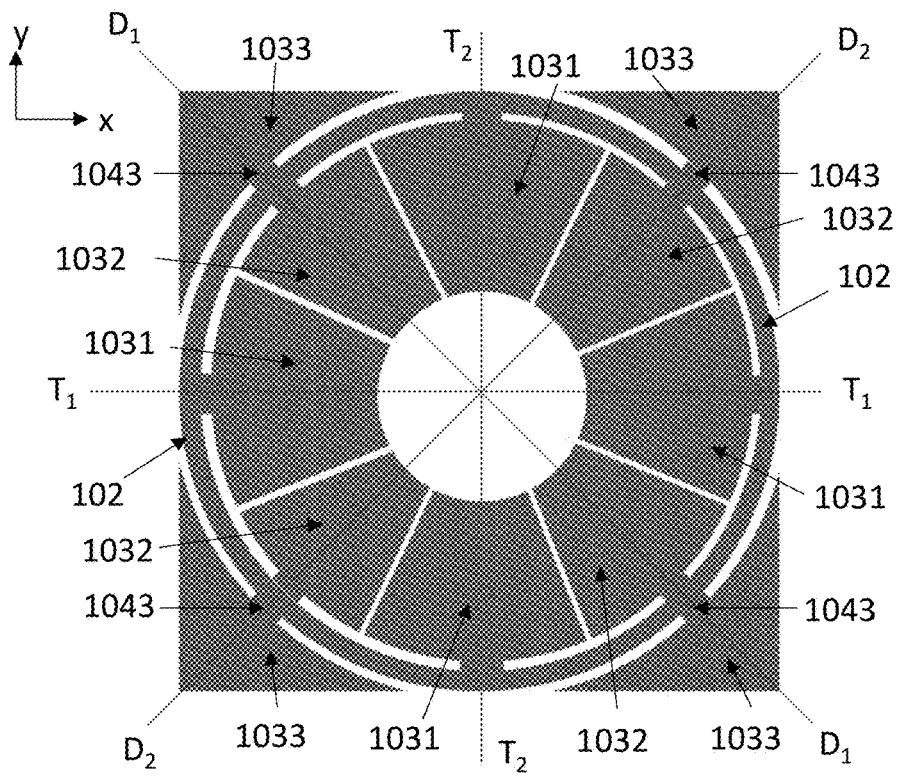

FIG. 10b illustrates an alternative embodiment where the mass elements comprise inner mass elements 1031 and 1032 which are located inside the ring 102 and outer mass elements 1033 which are located outside the ring 102. As in FIG. 10a, the number of inner mass elements is eight, and each inner mass element 1031 or 1032 is placed so that it crosses one symmetry axis, so that it is symmetric in relation to that symmetry axis, and so that its bridge connector is centered on that symmetry axis. Furthermore, the number of outer mass elements 1033 is four, and each outer mass element 1033 is placed so that it crosses a diagonal symmetry axis, so that it is symmetric in relation to that diagonal symmetry axis, and so that its bridge connector 1043 is centered on that diagonal symmetry axis.

The outer mass elements 1033 are attached to the ring 102 with bridge connectors 1043 which cross the same diagonal symmetry axis as the mass element. When sense oscillation occurs, mass elements 1033 will move back and forth along the diagonal symmetry axes $D_1$ and $D_2$.

The mass element distribution illustrated in FIG. 10b is convenient for utilizing all of the available area in square-shaped ring gyroscope components. When the gyroscope includes both inner and outer mass elements, the equalization of primary and secondary mode resonance frequencies may for example be obtained by letting the inner mass elements 1032, which cross the transversal symmetry axes, occupy narrower partial circle sectors than the inner mass elements 1031, which cross the diagonal symmetry axes. This option is illustrated in FIG. 10b. The combined area of one outer+inner mass element pair 1032+1033 may be equal to area of one inner mass element 1031.

Figure 10C:
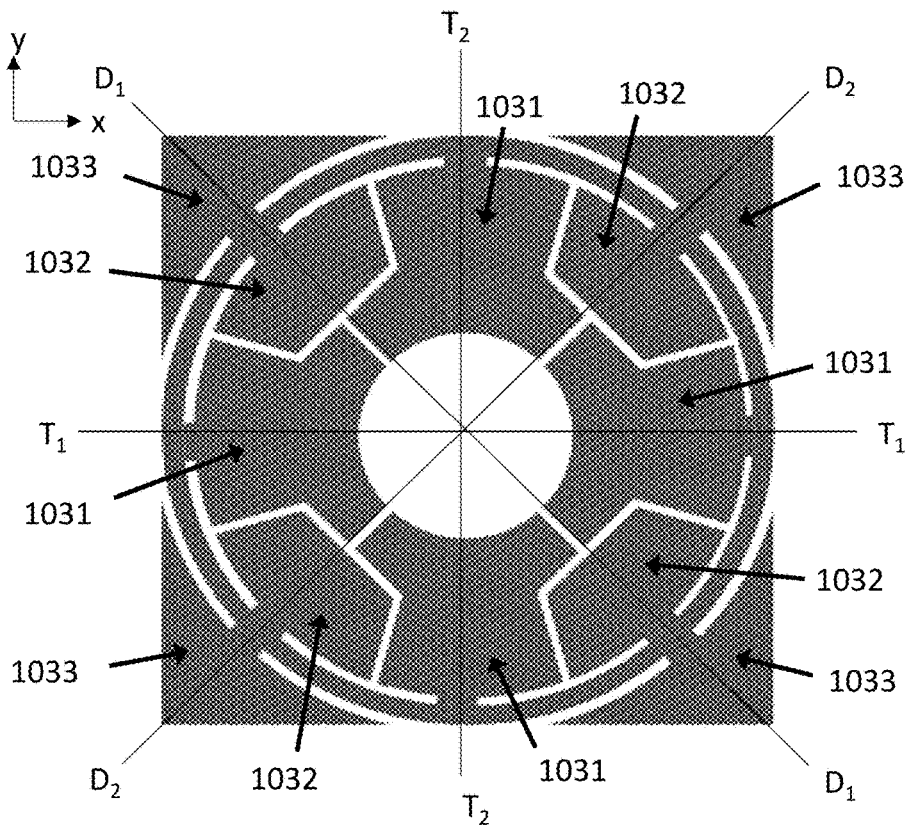

The inner mass elements do not necessarily have to be shaped like partial circle sectors. FIG. 10c illustrates a ring gyroscope where the inner mass elements 1031 and 1032 have been given a different shape. Many other shapes could also be used as long as the symmetry of the mass elements with respect to the four symmetry axes $T_1$, $T_2$, $T_3$ and $T_4$ is preserved.

In the configurations illustrated in FIGS. 10a-10c, four mass elements, 50% of the total mass, are connected to the ring at the crossings of the transversal symmetry axes and they will exhibit pure radial motion in the primary oscillation mode. The four mass elements connected to the ring at the crossings of the diagonal symmetry axes will exhibit a combination of tangential and rotary motion in the primary oscillation mode. The total effective moving mass of the primary mode is thus much more than 50% of the total mass, which is much more than the 29.7% for evenly distributed small mass elements without significant tangential and rotary motion. The same is true for the secondary oscillation mode.

Figure 10D:
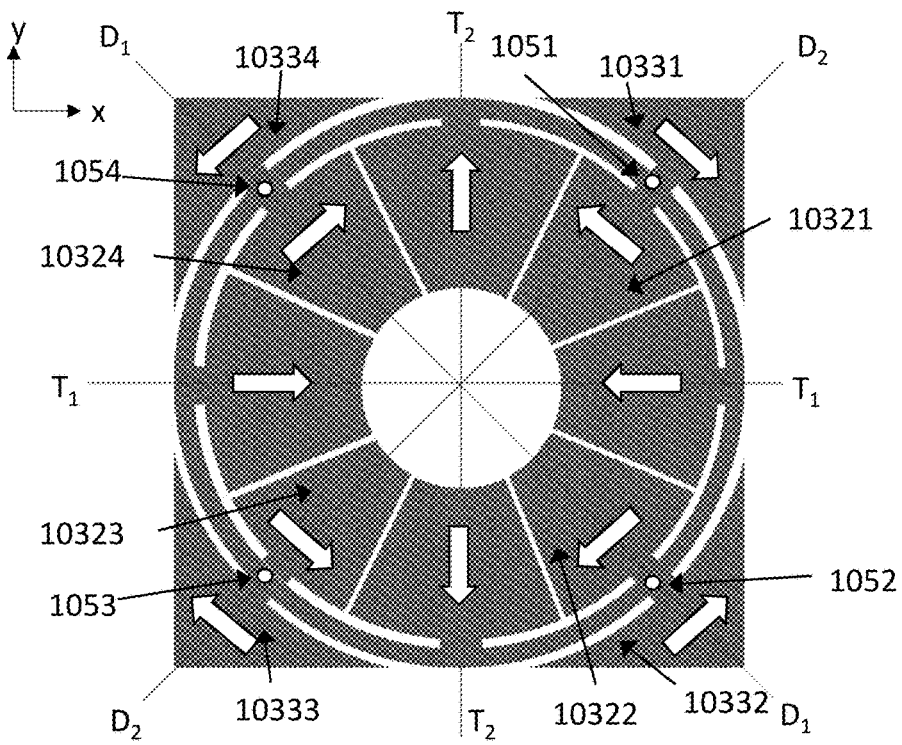

By way of example, FIG. 10*d* illustrates the motion of the mass elements during primary oscillation. Nodal points 1051-1054 are radially stationary in this resonance mode, but these points will exhibit rotation according to the elliptic mode shape. Each pair of inner and outer mass elements undergoes a rotational movement around an axis which is perpendicular to the xy-plane and passes through the nodal point between the mass elements, and there will also be a net tangential component of the motion if the center of gravity of the pair of masses doesn't coincide with the corresponding nodal point. This movement, as well as the radial movement of the mass elements which cross the transversal axes, is indicated with white arrows and they all contribute to the motion in the primary oscillation mode and thus to the energy stored in the mode. In the oscillation phase illustrated in FIG. 10*d*, the pairs 10321+10331 and 10323+10333 move in the clockwise direction in relation to nodal points 1051 and 1053, respectively, while the pairs 10322+10332 and 10324+10334 move in the counter-clockwise direction in relation to nodal points 1052 and 1054, respectively. In the opposite oscillation phase, where the motion of the ring perimeter has been reversed, each tangential movement in relation to a nodal point will be in the opposite direction.

Figure 10E:
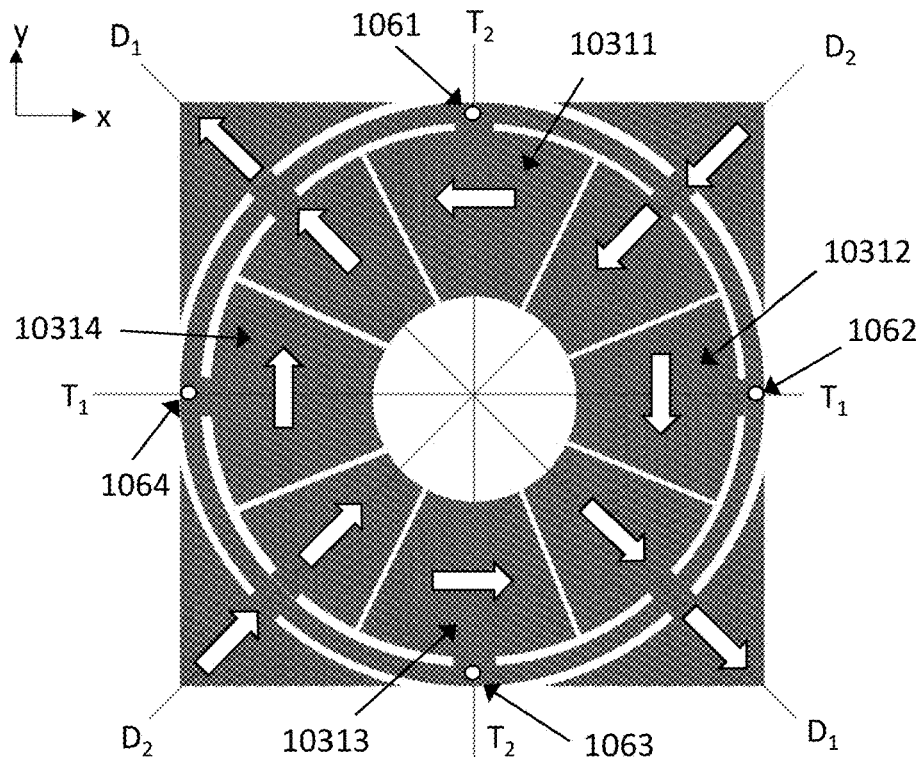

FIG. 10*e* illustrates the effect of similar radial motion and rotation of the nodal points during secondary oscillation. The nodal points on the axes $D_1$ and $D_2$ are now in pure radial motion, and the inner and outer mass elements which cross the diagonal symmetry axes therefore move only radially. The inner mass elements 10311-10314 which cross the transversal symmetry axes, on the other hand, are not in radial motion at all, but undergo a rotation around an axis which is perpendicular to the xy-plane and passes through the respective symmetry point 1061-1064 on the ring. Since the center of gravity of each mass element is offset from the corresponding nodal point the elements will exhibit also a significant tangential motion. In the oscillation phase illustrated in FIG. 10*e*, the mass elements 10311 and 10313 move in the clockwise direction in relation to symmetry points 1061 and 1063, respectively, while the pairs 10312 and 10314 move in the counter-clockwise direction in relation to symmetry points 1062 and 1064, respectively. In the opposite oscillation phase, where the motion of the ring perimeter has been reversed, each tangential movement around a symmetry point will be in the opposite direction.

Attachment of the four mass elements at the nodal points for each mode will increase the effective moving mass for each mode to 50% of the total mass of the elements. This is a significant improvement from the case with distributed added mass in only radial mode, as in FIGS. 9*a* and 9*b*, where only 29.7% of the total mass, similar to the pure ring, will contribute to each mode. In the secondary mode the sensor output signal will be 30% higher. The width of the ring can be increased by 10% with the same resonant frequency, increasing thus the capacitance. Alternatively, the diameter of the ring can be reduced by 10%.

The rotary and tangential motions of the mass elements described above further increase the motional energy to the oscillation mode. The effective motional mass for each mode will be much over 50% and up to 100% of the total mass of the elements, which is a great improvement compared to the distributed added mass in only radial mode as in FIGS. 9*a* and 9*b*, where only 29.7% of the total mass, similar to the pure ring, will contribute to each mode. In the secondary mode the sensor output signal will be 30-83% higher. The width of the ring can be increased by 10-22% with the same resonant frequency increasing thus the capacitance or alternatively, the diameter of the ring can be reduced by 10-22%.

If the ring gyroscopes illustrated in FIGS. 10*a*-10*e* are made of single crystal silicon, if the ring diameter is 1000 μm diameter ring, if the resonance frequency is 30 kHz, if the diameter of the center hole is 200 μm, and if piezo-transducers with 1 μm thick AlN film are utilized on the ring, then the ring can be 28 μm wide and the total transducer capacitance will be 6.8 pF. If the frequency is increased to 50 kHz, the ring can be 39 μm wide and the capacitance will be 9.4 pF. The latter design may be optimal for matching the capacitance to a practical amplifier circuit.

Figure 11A:
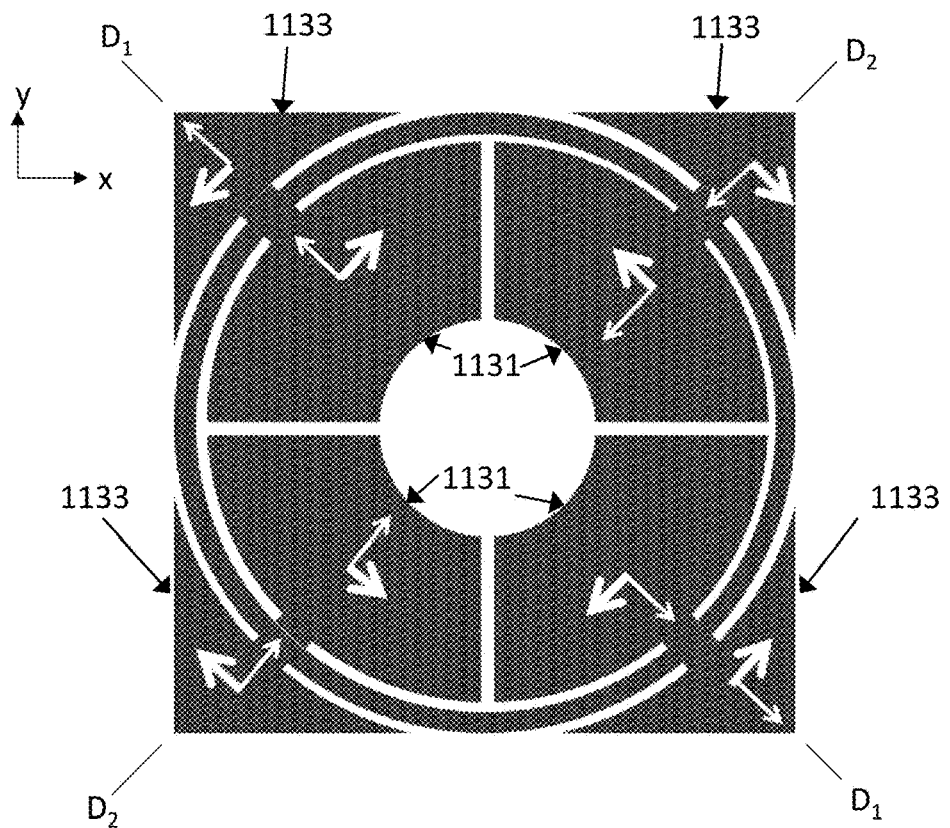
FIGS. 11a-11b illustrate ring gyroscopes.
Figure 11B:
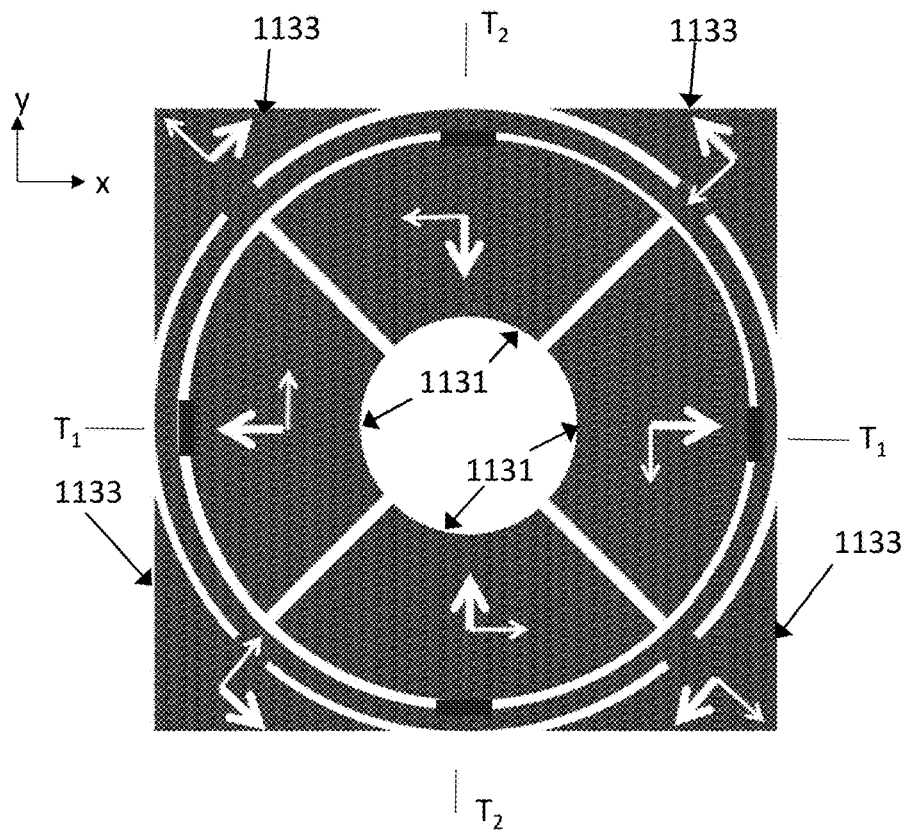

FIGS. 11*a*-11*b* illustrate exemplary ring gyroscopes according to alternative embodiments. In these embodiments, the size of the mass elements has again been increased compared to the previous embodiment, and their number has been decreased. FIG. 11*a* illustrates an embodiment where the mass elements comprise inner mass elements 1131 which are located inside the ring and outer mass elements 1133 which are located outside the ring. The number of inner mass elements is four, and each inner mass element is placed so that it crosses a diagonal symmetry axis, so that it is symmetric in relation to that diagonal symmetry axis, and so that its bridge connector is centered on that diagonal symmetry axis. The number of outer mass elements is four, and each outer mass element is placed so that it crosses a diagonal symmetry axis, so that it is symmetric in relation to that diagonal symmetry axis, and so that its bridge connector is centered on that symmetry axis.

The mass element configuration illustrated in FIG. 11*a* maximizes the mass contribution to primary and secondary oscillation to 100% of the total mass of mass elements, since all mass elements are attached to the ring at the nodal points and move equally in each mode. This is a great improvement compared to the distributed added mass in only radial mode as in FIGS. 9*a* and 9*b*, where only 29.7% of the total mass, similar to the pure ring, will contribute to each mode. In the secondary mode the sensor output signal will be 83% higher. The width of the ring can be increased by 22% with the same resonant frequency increasing thus the capacitance. Alternatively, the diameter of the ring can be reduced by 22%.

In FIG. 11*a*, the motion of each mass element 1131 and 1133 in one phase of primary oscillation is indicated with thick white arrows. In the opposite phase of primary oscillation, the motion of each mass element is in the reverse direction. Since all of the inner mass elements 1131 cross a diagonal symmetry axis, no mass element moves back and forth radially in primary oscillation. Instead, all mass elements 1131 and 1133 move in a tangential direction, as illustrated in FIG. 11*a*. The motion of each mass element 1131 and 1133 in one phase of secondary oscillation is indicated with thin white arrows. This motion occurs radially along the diagonal symmetry axes.

The ring gyroscope may alternatively be implemented with four mass elements located inside the ring, positioned like the inner mass elements 1131 in FIG. 11*a*, and with no outside mass elements. In this case the number of mass elements is four, and each mass element is placed so that it crosses a diagonal symmetry axis, so that it is symmetric in relation to that diagonal symmetry axis, and so that its bridge connector is centered on that symmetry axis. This configuration has not been separately illustrated. The movement of the mass elements in this configuration during primary and secondary oscillation will be the same as the movement which was illustrated with arrows for mass elements 1131 in FIG. 11*a*.

FIG. 11*b* illustrates another embodiment where the mass elements comprise inner mass elements 1131 which are located inside the ring and outer mass elements 1133 which are located outside the ring In this case the number of inner mass elements 1131 is four, and each inner mass element is placed so that it crosses a transversal symmetry axis, so that it is symmetric in relation to that transversal symmetry axis, and so that its bridge connector is centered on that transversal symmetry axis. The number of outer mass elements 1133 is four, and each outer mass element is placed so that it crosses a diagonal symmetry axis, so that it is symmetric in relation to that diagonal symmetry axis, and so that its bridge connector is centered on that symmetry axis.

As in the previous figure, the motion of each mass element 1131 and 1133 in one phase of primary oscillation is indicated in FIG. 11*b* with thick white arrows. In the opposite phase of primary oscillation, the motion of each mass element is in the reverse direction. Since all of the inner mass elements 1131 cross a transversal symmetry axis, the inner mass elements move back and forth radially in primary oscillation. The outer mass elements move in a tangential direction in primary oscillation. The motion of each mass element 1131 and 1133 in one phase of secondary oscillation is indicated with thin white arrows. Outer mass elements 1133 move radially along the diagonal symmetry axes, while inner mass elements 1131 move tangentially.

The mass element configuration illustrated in FIG. 11*a* maximizes the mass contribution to primary oscillation to 100% of the total mass of mass elements, since all mass elements are attached to the ring at the nodal points and move equally in each mode. This is a great improvement compared to the distributed added mass in only radial mode as in FIGS. 9*a* and 9*b*, where only 29.7% of the total mass, similar to the pure ring, will contribute to each mode. In the secondary mode the sensor output signal will be 83% higher. The width of the ring can be increased by 22% with the same resonant frequency increasing thus the capacitance or alternatively, the diameter of the ring can be reduced by 22%.

As in the previous example, the ring gyroscope may alternatively be implemented with four mass elements located inside the ring, positioned like the inner mass elements 1131 in FIG. 11*b*, and with no outside mass elements. In this case the number of mass elements is four, and each mass element is placed so that it crosses a transversal symmetry axis, so that it is symmetric in relation to that transversal symmetry axis, and so that its bridge connector is centered on that symmetry axis. This configuration has not been separately illustrated. The movement of the mass elements in this configuration during primary and secondary oscillation will be the same as the movement which was illustrated with arrows for mass elements 1131 in FIG. 11*b*.

Alternatively, mass elements are located outside the ring. The number of mass elements is then four, and each mass element is placed so that it crosses a diagonal symmetry axis, so that it is symmetric in relation to that diagonal symmetry axis, and so that its bridge connector is centered on that symmetry axis. This configuration has not been separately illustrated. The movement of the mass elements in this configuration during primary and secondary oscillation will be the same as the movement which was illustrated with arrows for outer mass elements 1133 in FIGS. 11*a* and 11*b*.

If the ring gyroscopes illustrated in FIGS. 11*a* and 11*b* are made of single crystal silicon material, if they are designed with a 1000 μm ring diameter and a 30 kHz resonant frequency, if the hole diameter at the center of the ring if 200 μm, and if the ring is provided with piezo-transducers with a 1 μm AlN film, then the ring width can be 28 μm and the total transducer will be capacitance 6.8 pF. If the frequency is increased to 50 kHz, the ring can be 39 μm wide and the capacitance will be 9.4 pF. The latter design may be optimal for matching the capacitance to a practical amplifier circuit.

Ring gyroscopes are fixed to a substrate with one or more suspenders, which should be sufficiently rigid to support the weight of the ring, but sufficiently flexible not to disturb either resonance mode. Furthermore, the suspenders should preferably stiffen the ring gyroscope in unwanted out-of-plane vibration modes and stiffly suspend it in both in-plane and out-of-plane directions so that unwanted in-plane and out-of-plane translation and rotation, which may arise from external vibrations, are minimized. It can be challenging to meet all of these criteria especially when the ring gyroscope includes added mass elements.

Any suspender embodiment described below can be combined with any of the preceding embodiments discussed in this disclosure. Piezoelectric transducers have been omitted from the figures to preserve clarity. Furthermore, the transversal and diagonal symmetry axes have also been omitted for clarity, but their location in the Figure is the same as in all of the preceding figures.

In the following suspender embodiments, four mass elements are illustrated. However, the number of mass elements can also be different. Each of the following suspender embodiments must be combined with an inner suspension arrangement which supports either the ring, or the mass elements located inside the ring, on the inside of the ring. A spiralling suspension arrangement is illustrated inside the ring in each suspender embodiment. Alternative inner suspension arrangements are illustrated at the end of this disclosure.

First Suspender Embodiment

Mass elements are shown in the figures which illustrate the first, second and third suspender embodiments because the need for effective suspension is especially critical when the total mass of the oscillating system increases. However, each suspender embodiment may alternatively be implemented without any mass elements attached to the ring.

Figure 12A:
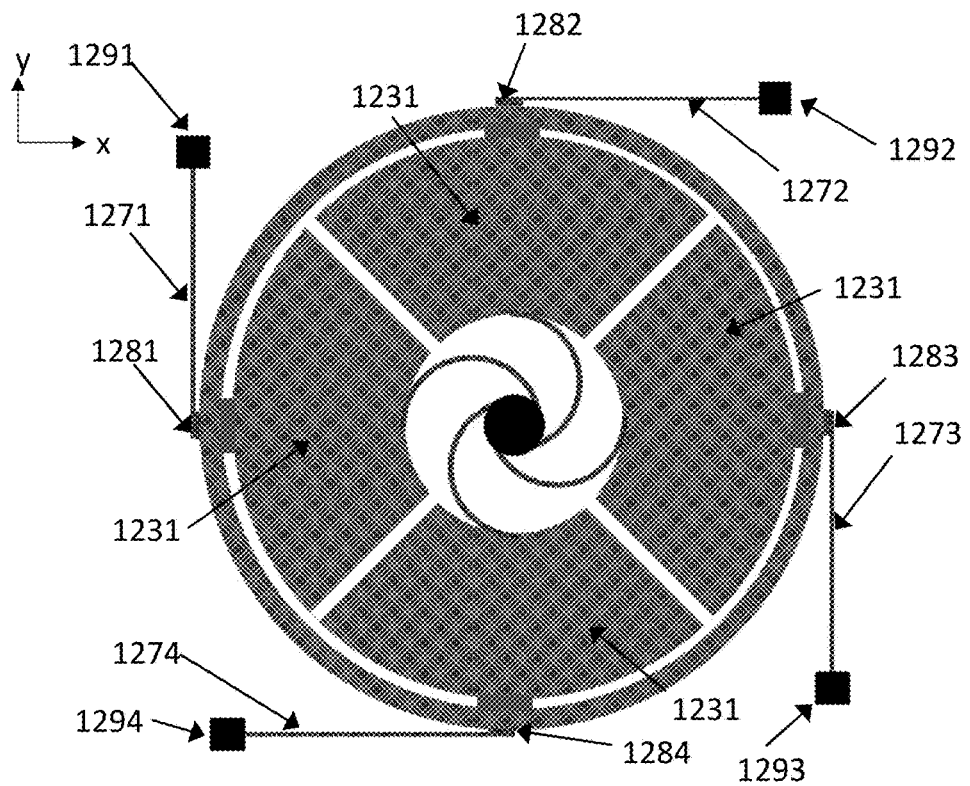
FIGS. 12a-12b illustrate ring gyroscopes according to a first suspender embodiment.

According to a first suspender embodiment, the number of anchor points is N and each anchor point and each suspension attachment point is connected to only one outer suspender. FIG. 12*a* illustrates a ring gyroscope according to this embodiment where N equals 4. The ring gyroscope comprises four outer suspenders 1271-1274. One end of each outer suspender is attached to an anchor point 1291-1294, and the other end of each outer suspender is attached to a suspension attachment point 1281-1284 on the ring perimeter. The ring gyroscope comprises four mass elements 1231 inside the ring.

In order to stabilize the ring against unwanted vibration and maintaining flexibility in the two desired resonance modes, the outer suspenders should have great flexibility radially but very little flexibility tangentially. Orienting the lengthwise direction of each outer suspender tangentially (or at least substantially tangentially), as illustrated in FIG. 12*a*, achieves the latter aim. To achieve radial flexibility while also remaining rigid in the out-of-plane direction, the outer suspenders should be narrower in the radial direction of the ring and thick in the vertical z-direction.

The radial width of each outer suspender 1271-1274 may, for example, be from 1 μm to 10 μm and the thickness of each outer suspender may be from 4 to 100 μm. The thickness-to-width aspect ratio should at least be larger than 4, but it can be much larger. The length of the outer suspenders 1271-1274 may, for example, be 0.1-0.5 times the diameter of the ring. The preferable aspect ratio is the same in the subsequent suspender embodiments of this disclosure as well, but the optimum length may depend on the number or outer suspenders.

All four suspenders 1271-1274 have been oriented in the same direction in FIG. 12*a*, so that they point in the clockwise tangential direction from the suspension attachment point. However, any or all of the outer suspenders can also be oriented in the opposite direction, so that they point counter-clockwise from the suspension attachment point. For example, the suspenders 1271 and 1273 could be oriented clockwise, while suspenders 1272 and 1274 could be oriented counter-clockwise. These considerations about orientation apply in the subsequent suspender embodiments as well.

In FIG. 12*a*, the suspension attachment points 1281-1284 are located at the points where the transversal symmetry axes $T_1$ and $T_2$ cross the ring. They could alternatively be located at the points where the diagonal symmetry axes $D_1$ and $D_2$ cross the ring. In either of these two attachment configurations, any added stiffness which each outer suspender may contribute to the ring gyroscope will act only in the direction of the symmetry axes. The direction of the resonance oscillation will remain aligned with these axes. In other words, the number N may be four, and each suspension attachment point may be located at a point where a transversal symmetry axis crosses the ring, or each suspension attachment point may be located at a point where a diagonal symmetry axis crosses the ring. Alternatively, N may be eight, and each suspension attachment point may be located at a point where a symmetry axis crosses the ring.

The suspension attachment points 1281-1284 could also be located elsewhere on the ring perimeter. Shifting them away from the symmetry axes may slightly shift the direction of the resonance oscillation in relation to the symmetry axes (keeping in mind that the symmetry axes are defined only by the location of the piezoelectric transducers on the ring). It will depend on the stiffness of the outer suspenders if this introduces significant errors to the measurement or not. If it is not possible to place the suspension attachment points on the symmetry axes, it is preferable that they should at least be located symmetrically with respect to all symmetry axes.

The outer suspenders 1271-1274 may not all have the same length and width. However, it is usually preferable to give every outer suspender the same dimensions, so that any rigidity which they may contribute to the oscillating ring at each suspension attachment point will be of equal magnitude. The attachment points 1281-1284 may be aligned with the bridge connectors of each mass element 1231, as indicated in FIG. 12*a*. More generally, in any of the suspender embodiments presented in this disclosure, the number of mass elements may equal the number of suspension attachment points, and each suspension attachment point may be aligned on the same ring radius as one bridge connector. However, the placement of the outer suspenders does not necessarily have to be aligned with the bridge connectors as long as the outer suspenders are sufficiently flexible in comparison to the ring. These considerations about suspender dimensions and alignment with bridge connectors apply in the subsequent suspender embodiments as well.

Figure 12B:
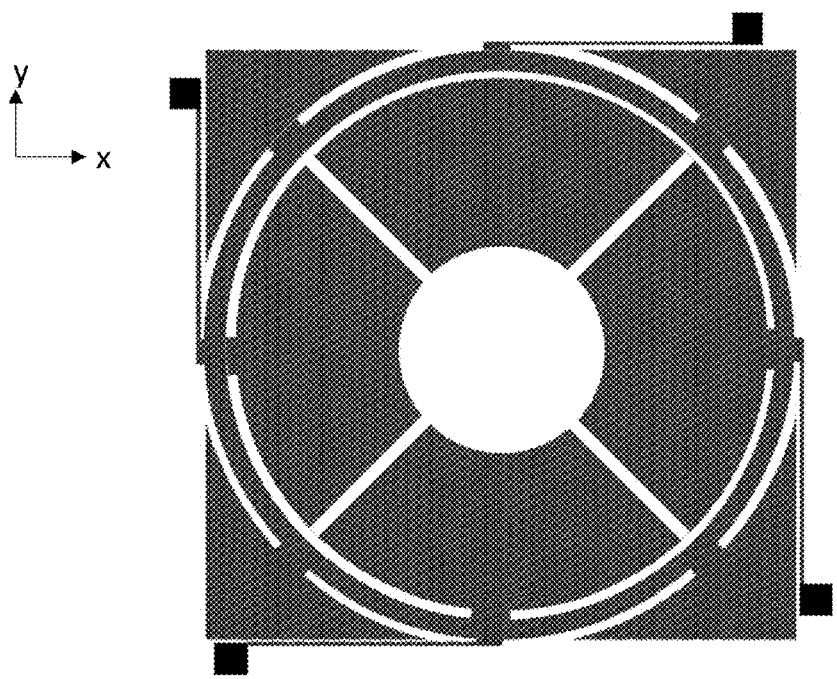

FIG. 12*b* illustrates a device where four outer suspenders have been implemented together with four outer mass elements.

Figure 13A:
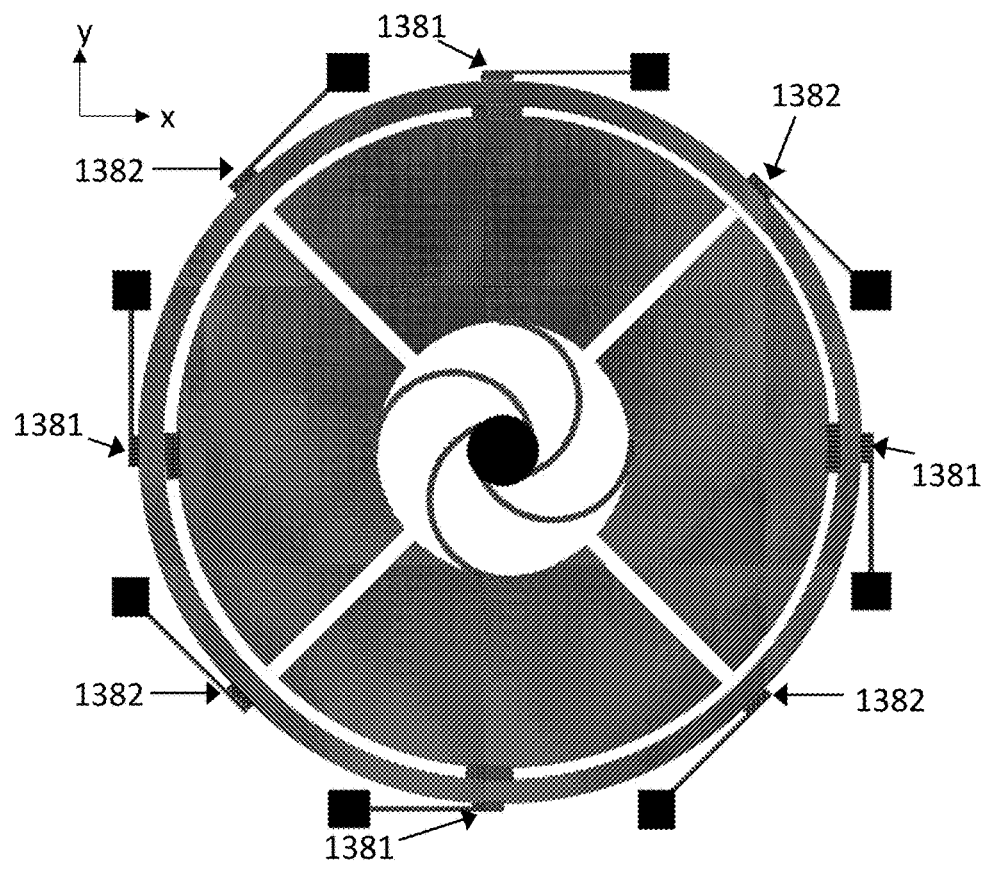
FIGS. 13a-13b also illustrate ring gyroscopes according to a first suspender embodiment.

FIG. 13*a* illustrates an embodiment where the number N is eight, and each suspension attachment point is located at a point where a symmetry axis crosses the ring. Suspension attachment points 1381 are located at the points where the transversal symmetry axes cross the ring, and suspension attachment points 1382 are located at the points where the diagonal symmetry axes cross the ring. As above, if the suspension attachment points are shifted away from these locations, it would be preferable to place them symmetrically with respect to the symmetry axes, but this is not a necessary requirement if the outer suspenders are very flexible.

Figure 13B:
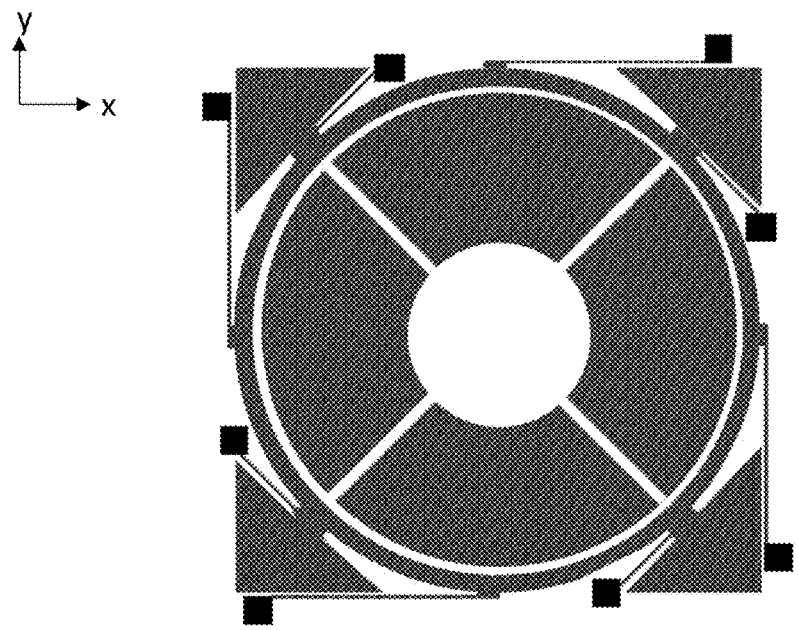

FIG. 13*b* illustrates a device where eight outer suspenders have been implemented together with four outer mass elements.

Figure 14:
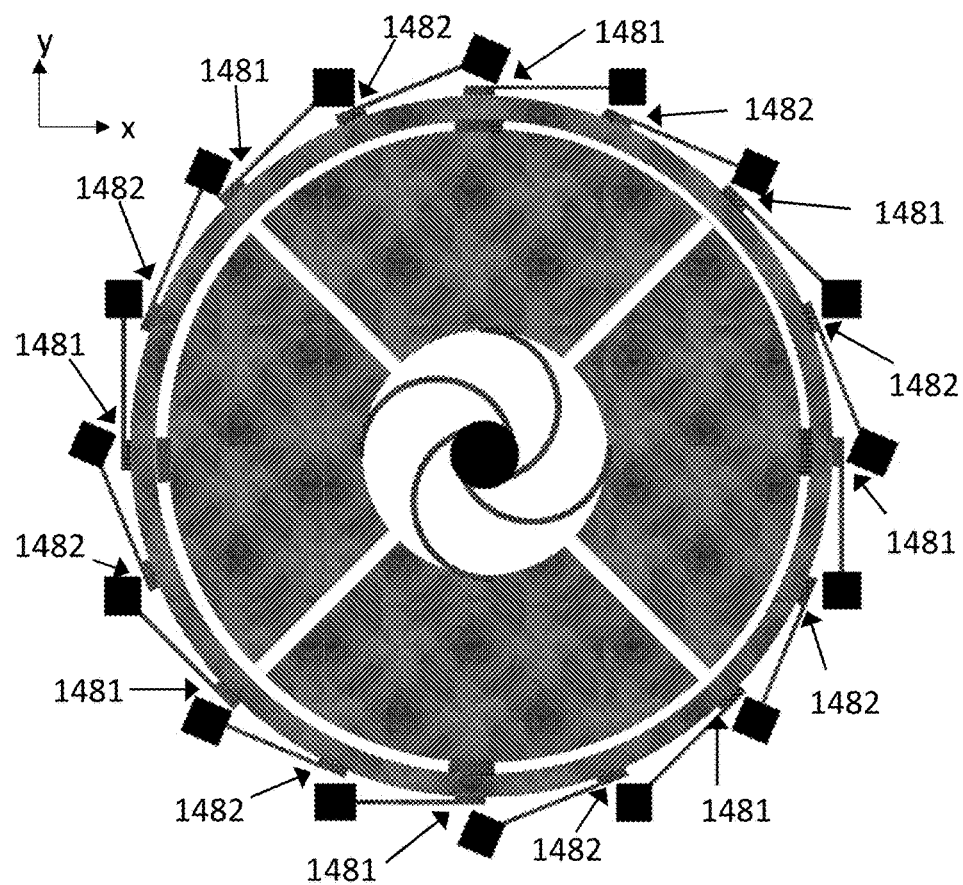
FIG. 14 also illustrates a ring gyroscope according to a first suspender embodiment.

FIG. 14 illustrates a ring gyroscope where N is sixteen and the suspension attachment points comprise a first set of eight suspension attachment points 1481 located where the transversal and diagonal symmetry axes cross the ring, and a second set of eight suspension attachment points 1482, where each suspension attachment point 1482 is located halfway between two suspension attachment points 1481 of the first set. The number of suspension attachment points can be increased even further if necessary.

In any of the suspender embodiments presented in this disclosure, the suspension attachment points may be distributed symmetrically with respect to both the transversal symmetry axes and the diagonal symmetry axes.

In any of the suspender embodiments presented in this disclosure, one or more of the outer suspender may be coated with an electrical conductor which is connected to at least one piezoelectric transducer on the ring. The electrical conductor may be routed to external circuitry from the corresponding anchor point. In other words, the outer suspenders may be utilized for transmitting electrical signals to and from piezoelectric transducers on the ring.

Second Suspender Embodiment

According to a second suspender embodiment, the number of anchor points is N, and each anchor point is connected to only one outer suspender, and each suspension attachment point is connected to two outer suspenders which extend in opposite tangential directions from the suspension attachment point.

Figure 15:
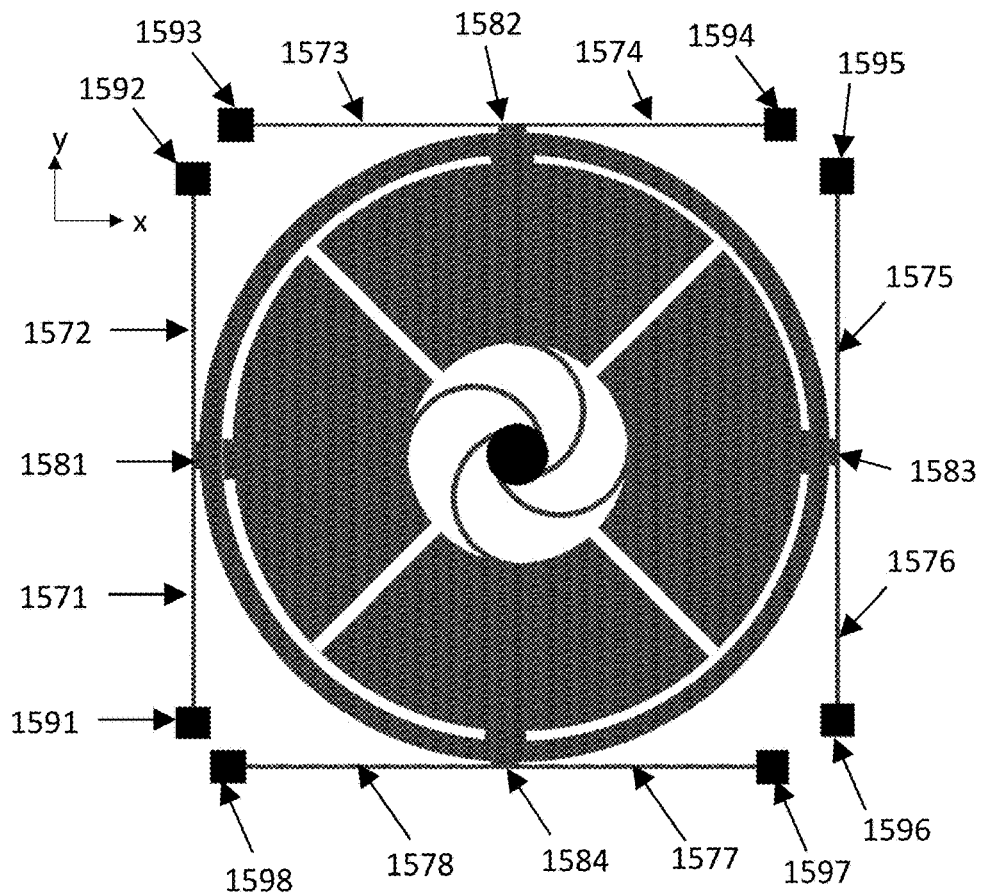
FIG. 15 illustrates a ring gyroscope according to a second suspender embodiment.

FIG. 15 illustrates a ring gyroscope according to this embodiment. In the illustrated case N equals eight, so that there are eight anchor points 1591-1598 and eight outer suspenders 1571-1578, but only four suspension attachment points 1581-1584. The second suspender embodiment can also be implemented for example with N equal to sixteen. The number of suspension attachment points would in that case be eight. Any other number integer N divisible by two could in principle also be used, but the symmetry considerations stated below may pose some restrictions on this choice.

The discussion given in the first suspender embodiment with regard to the placement of suspension attachment points applies in this second suspender embodiment as well. In other words, if N is eight, each suspension attachment point may be located at a point where a transversal symmetry axis crosses the ring, or each suspension attachment point may be located at a point where a diagonal symmetry axis crosses the ring. This is typically the most beneficial configuration for minimizing interference in the ring resonance modes, as explained above. If N is sixteen, each suspension attachment point may be located at a point where a symmetry axis crosses the ring. In other words, four suspension attachment points may be located where the transversal symmetry axes cross the ring, and four suspension attachment points may be located where the diagonal symmetry axes cross the ring.

A secondary alternative is to place the suspension attachment points in locations which are not crossing points between symmetry axes and the ring, so that the suspension attachment points are placed symmetrically with respect to the symmetry axes. However, as stated above in the first suspender embodiment, even this is not a necessary feature because suspenders can in principle be attached anywhere on the ring if they are so flexible that their interference with the ring resonance modes can for all practical purposes be disregarded. The flexibility of the suspenders depends on their dimensions.

Four inner mass elements are illustrated in FIG. 15, but the number of mass elements can be selected freely also in this second suspender embodiment. The comments given in the first suspender embodiment on the placement of suspension attachment points in relation to bridge connectors apply also in this second suspender embodiment. Outer mass elements can be incorporated in the ring gyroscope with similar arrangements as in FIGS. 12b and 13b.

Third Suspender Embodiment

According to a third suspender embodiment, the number of anchor points is N/2, and each anchor point is connected to two outer suspenders, and each suspension attachment point is connected to two outer suspenders which extend in opposite tangential directions from the suspension attachment point.

Figure 16:
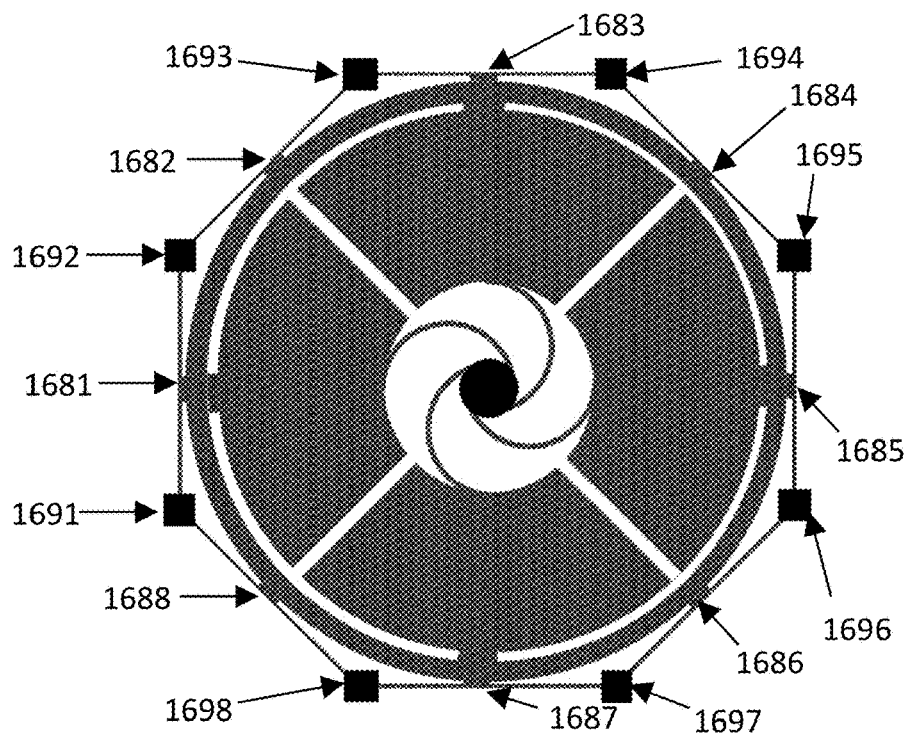
FIG. 16 illustrates a ring gyroscope according to a third suspender embodiment.

FIG. 16 illustrates a ring gyroscope according to this embodiment. In the illustrated case N equals sixteen, so that there are eight anchor points 1691-1698, sixteen outer suspenders and eight suspension attachment points 1681-1688. If N is sixteen, each suspension attachment point may be located at a point where a symmetry axis crosses the ring, as illustrated in FIG. 16.

The second suspender embodiment can also be implemented for example with N equal to eight. In this case, each suspension attachment point may located at a point where a transversal symmetry axis crosses the ring, or each suspension attachment point may be located at a point where a diagonal symmetry axis crosses the ring.

Any other number integer N divisible by two could in principle also be used, as long as the outer suspenders are long enough to reach around the perimeter of the ring, and as long as symmetry considerations are taken into account.

The discussion given in the first suspender embodiment with regard to the placement of suspension attachment points again applies. As before, four inner mass elements are illustrated in FIG. 16, but the number of mass elements can be selected freely also in this third suspender embodiment. The comments given in the first suspender embodiment on the placement of suspension attachment points in relation to bridge connectors apply also in this second suspender embodiment. Outer mass elements can be incorporated in the ring gyroscope for example by connecting their bridge connectors to suspension attachment points 1682, 1684, 1686 and 1688 in FIG. 16.

Figure 17A:
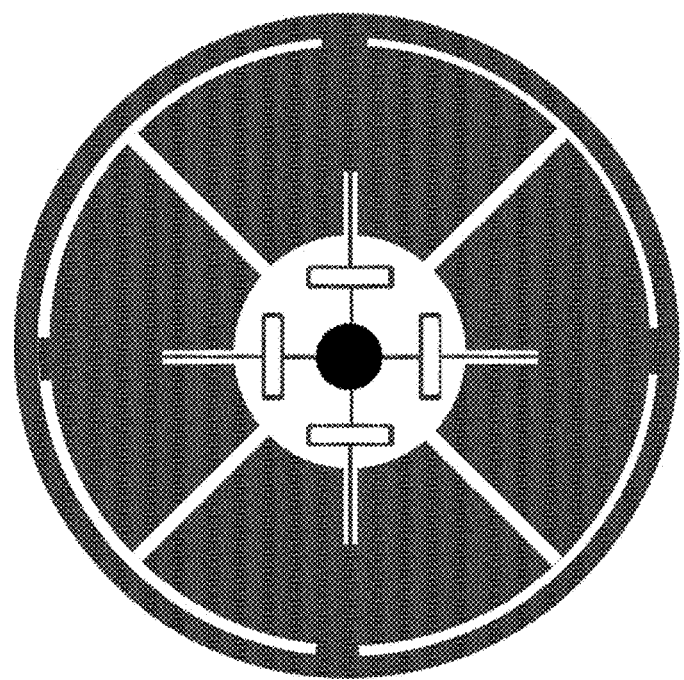
FIGS. 17a and 17b illustrate alternative configurations for the central ring suspension.
Figure 17B:
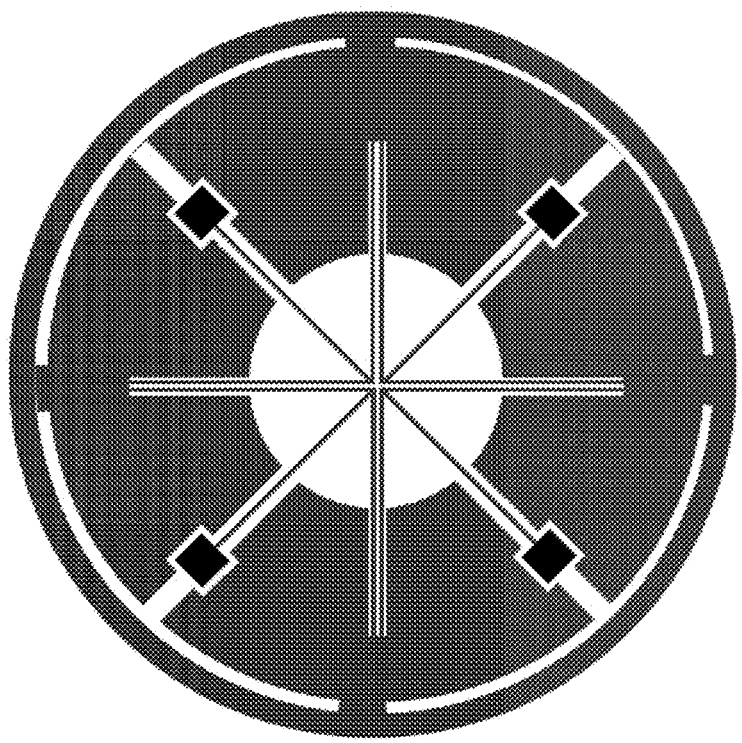

FIGS. 17a and 17b illustrate alternative configurations for the central ring suspension, which may be combined with any of arrangement of outer suspenders presented above.

The invention claimed is:

1. A ring gyroscope which comprises:
    a substantially circular and flexible ring which defines a ring plane, and which is flexibly suspended from a substrate so that the ring can undergo shape oscillation in the ring plane, wherein the ring comprises first and second transversal symmetry axes in the ring plane which are orthogonal to each other, and the ring also comprises first and second diagonal symmetry axes in the ring plane which are orthogonal to each other, and the angle between each transversal symmetry axis and the adjacent diagonal symmetry axis is 45°,
    wherein the gyroscope further comprises
    one or more primary piezoelectric split transducers configured to drive the ring into resonance oscillation, placed on first sectors of the ring, and one or more secondary piezoelectric split transducers configured to sense the oscillation of the ring, placed on one or more second sectors of the ring, and each first sector crosses a transversal symmetry axis of the ring and is symmetric with respect to that symmetry axis, and each second sector crosses a diagonal symmetry axis of the ring and is symmetric with respect to that diagonal symmetry axis of the ring,
    a suspension structure configured to support the weight of the ring, wherein the suspension structure comprises N outer suspenders, where N is an integer greater than or equal to two, and each outer suspender extends along a ring tangent from a suspension attachment point on the outer edge of the ring to an anchor point, wherein the suspension attachment points are substantially evenly distributed along the ring perimeter, and the ratio between the vertical thickness of each outer suspender in the direction perpendicular to the ring plane and the radial width of that outer suspender in the direction of the ring radius is at least 4:1.

2. A ring gyroscope according to claim 1, wherein the number of anchor points is N, and each anchor point and each suspension attachment point is connected to only one outer suspender.

3. A ring gyroscope according to claim 2, wherein N is four, and each suspension attachment point is located at a point where a transversal symmetry axis crosses the ring, or that each suspension attachment point is located at a point where a diagonal symmetry axis crosses the ring.

4. A ring gyroscope according to claim 2, wherein N is eight, and each suspension attachment point is located at a point where a symmetry axis crosses the ring.

5. A ring gyroscope according to claim 4, wherein N is eight, and each suspension attachment point is located at a point where a transversal symmetry axis crosses the ring, or each suspension attachment point is located at a point where a diagonal symmetry axis crosses the ring.

6. A ring gyroscope according to claim 2, wherein N is sixteen and the suspension attachment points comprise a first set of eight suspension attachment points located where the transversal and diagonal symmetry axes cross the ring, and a second set of eight suspension attachment points where each suspension attachment point is located halfway between two suspension attachment points of the first set.

7. A ring gyroscope according to claim 2, wherein N is sixteen and each suspension attachment point is located at a point where a symmetry axis crosses the ring.

8. A ring gyroscope according to claim 1, wherein the number of anchor points is N, and each anchor point is connected to only one outer suspender, and each suspension attachment point is connected to two outer suspenders which extend in opposite tangential directions from the suspension attachment point.

9. A ring gyroscope according to claim 1, wherein N is eight and the number of anchor points is four, and each anchor point is connected to two outer suspenders, and each suspension attachment point is connected to two outer suspenders which extend in opposite tangential directions from the suspension attachment point, and wherein each suspension attachment point is located at a point where a transversal symmetry axis crosses the ring, or each suspension attachment point is located at a point where a diagonal symmetry axis crosses the ring.

10. A ring gyroscope according to claim 1, wherein N is sixteen and the number of anchor points is eight, and each anchor point is connected to two outer suspenders, and each suspension attachment point is connected to two outer suspenders which extend in opposite tangential directions from the suspension attachment point, and each suspension attachment point is located at a point where a symmetry axis crosses the ring.

11. A ring gyroscope according to claim 1, wherein the suspension attachment points are distributed symmetrically with respect to both the transversal symmetry axes and the diagonal symmetry axes.

12. A ring gyroscope according to claim 11, wherein the number of mass elements equals the number of suspension attachment points, and each suspension attachment point is aligned on the same ring radius as one bridge connector.

13. A ring gyroscope according to claim 1, wherein the gyroscope also comprises four or more mass elements which form a symmetrical mass distribution in relation to both the first and second transversal symmetry axes and to the first and second diagonal symmetry axes, wherein each mass element is attached to the ring from a bridge connector and the bridge connectors are evenly distributed along the ring.

* * * * *